US012787307B2

(12) United States Patent
Kuo et al.

(10) Patent No.: US 12,787,307 B2
(45) Date of Patent: Nov. 3, 2026

(54) STRUCTURE AND METHOD FOR DEEP TRENCH CAPACITOR

(71) Applicant: Taiwan Semiconductor Manufacturing Company, Ltd., Hsin-Chu (TW)

(72) Inventors: Fu-Chiang Kuo, Hsinchu City (TW); Po Cheng Kung, Kaohsiung City (TW); Hsin-Liang Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 716 days.

(21) Appl. No.: 18/188,082

(22) Filed: Mar. 22, 2023

(65) Prior Publication Data

US 2024/0321944 A1 Sep. 26, 2024

(51) Int. Cl.
*H01L 21/02* (2006.01)
*H10D 1/00* (2025.01)
*H10D 1/68* (2025.01)

(52) U.S. Cl.
CPC ............. *H10D 1/042* (2025.01); *H10D 1/716* (2025.01)

(58) Field of Classification Search
CPC ... H01L 2924/1205; H01L 2924/01029; H01L 21/76877; H01L 21/76879; H01L 23/53238; H01L 21/53228; H01L 21/53223; H01L 21/5226; H01L 24/80; H01L 25/162; H01L 24/73; H01L 2224/24147; H10D 1/68; H10D 1/716; H10D 1/042; H10W 20/035; H10W 20/056; H10W 20/42; H10B 12/038
See application file for complete search history.

(56) References Cited

U.S. PATENT DOCUMENTS

| | | | | | |
|---|---|---|---|---|---|
| 2005/0127422 | A1 | 6/2005 | Hsiao et al. | | |
| 2013/0161792 | A1* | 6/2013 | Tran | H10D 1/62 | 438/386 |
| 2014/0291847 | A1* | 10/2014 | Zhang | H01L 23/53238 | 438/653 |
| 2014/0374880 | A1* | 12/2014 | Chen | H10D 1/68 | 257/532 |
| 2024/0136312 | A1* | 4/2024 | Verma | H01L 24/16 | |

FOREIGN PATENT DOCUMENTS

| | | |
|---|---|---|
| TW | 200411906 | 7/2004 |
| TW | 200512931 | 4/2005 |
| TW | 201133784 | 10/2011 |
| TW | 202310430 | 3/2023 |

* cited by examiner

*Primary Examiner* — John A Bodnar
(74) *Attorney, Agent, or Firm* — HAYNES AND BOONE, LLP

(57) ABSTRACT

The present disclosure provides an integrated circuit (IC) structure that includes a first substrate having an integrated circuit formed thereon; a second substrate bonded to the first substrate; and a deep trench capacitor formed on the second substrate and electrically connected to the integrated circuit. The deep trench capacitor includes a stack of conductive layers and dielectric layers disposed in deep trenches, and conductive plugs landing on the conductive layers, respectively. Each of the conductive plugs includes a first metal layer, a second metal layer disposed on the first metal layer, and a third metal layer disposed on the second metal layer. The first, second and third metal layers are different in composition.

20 Claims, 27 Drawing Sheets

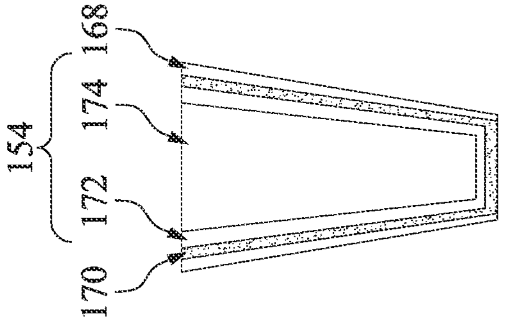
FIG. 9C
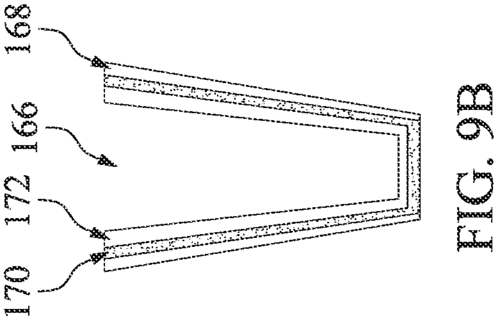
FIG. 9B
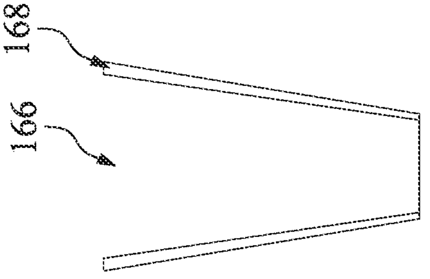
FIG. 9A
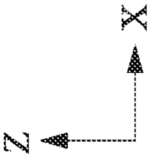

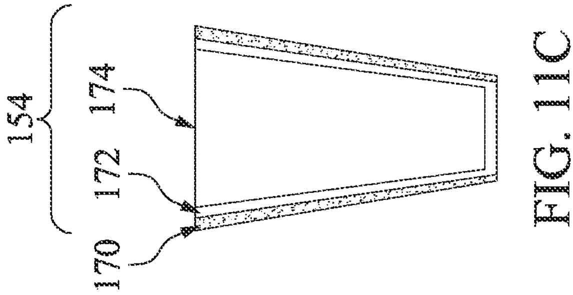
FIG. 11C
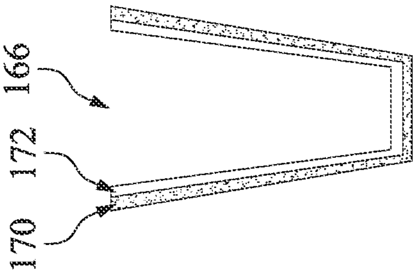
FIG. 11B
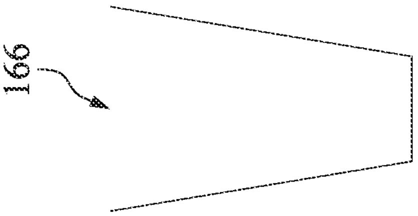
FIG. 11A
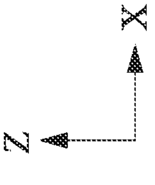

STRUCTURE AND METHOD FOR DEEP TRENCH CAPACITOR

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, a capacitor, as a passive device, is an important device in integrated circuit (IC) and is widely used for various purposes, such as in random access memory (RAM) non-volatile memory devices, decoupling capacitor, or RC circuit. When the IC moves to advanced technology nodes with less feature sizes, a capacitor is almost non-shrinkable and cannot be scaled down to small dimensions due to capacitor characteristics. A capacitor takes a significant circuit area penalty. Furthermore, the existing method making a capacitor introduces defects into the capacitor and causes undesired issues, such as material integration and current leakage through the capacitor. Accordingly, it would be desirable to provide a capacitor structure integrated with other circuit devices and a method of manufacturing thereof absent the disadvantages discussed above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A, 9B and 9C are sectional views of a conductive plug of the deep trench capacitor of FIG. 8E at various fabrication stages, constructed at various fabrication stages according to various embodiments of the present disclosure;

FIGS. 11A, 11B and 11C are sectional views of a conductive plug of the deep trench capacitor of FIG. 10A or 10B at various fabrication stages, constructed at various fabrication stages according to various embodiments of the present disclosure;

DETAILED DESCRIPTION

Figure 1:
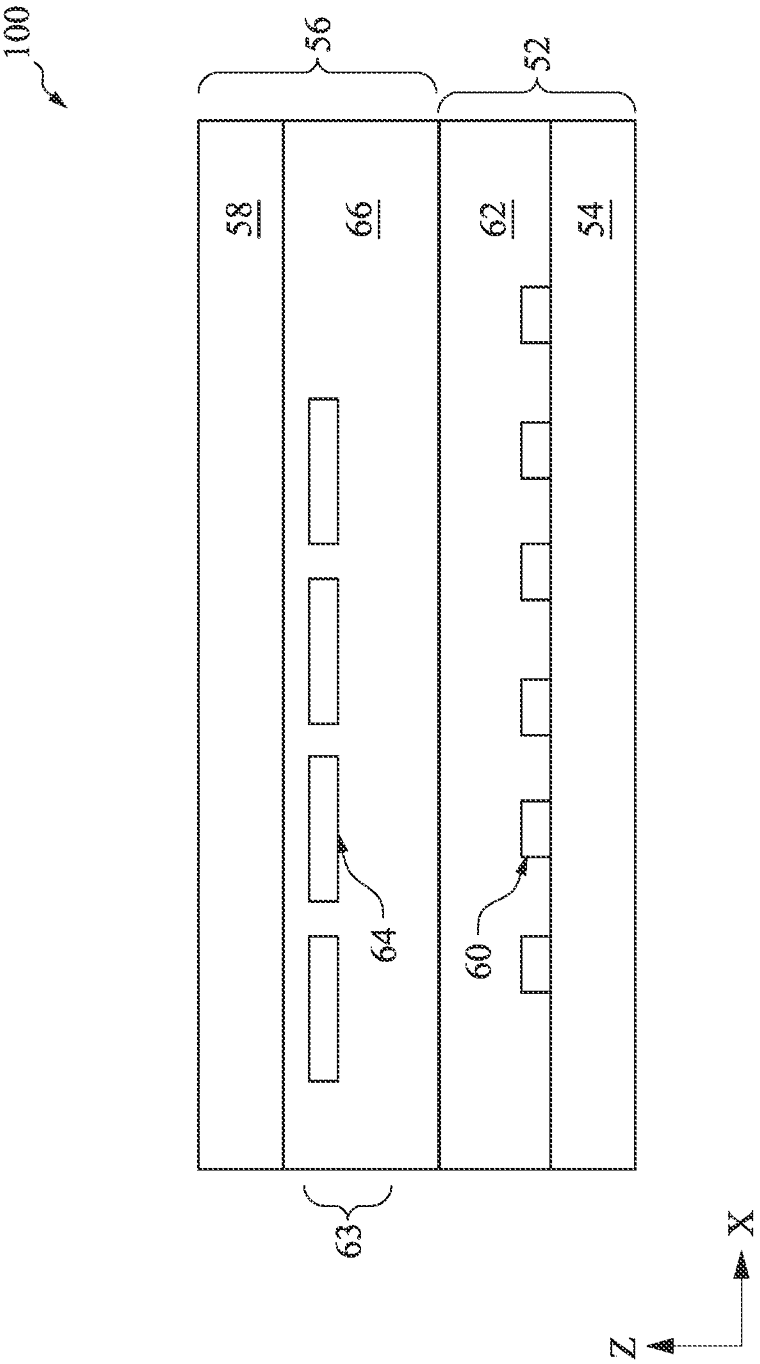
FIG. 1 is a sectional view of an integrated circuit (IC) structure Having a deep trench capacitor, constructed according to some embodiments of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower,"

"upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure relates generally to an integrated circuit (IC) structure and a method making the same, and more particularly, to a deep-trench capacitor device integrated with other devices to form a three-dimensional (3D) IC structure. The IC structure further includes other devices, such as field-effect transistors (FETs), fin-like FETs (FinFETs), and other multi-gate devices. In some examples, the multi-gate devices include gate-all-around (GAA) devices.

FIG. 1 is a sectional view of an IC structure 100, constructed in accordance with some embodiments of the present disclosure. The IC structure 100 includes a first circuit structure 52 formed on a first substrate 54 and a second circuit structure 56 formed on a second substrate 58. The first circuit structure 52 and the second circuit structure 56 are bonded together to form a 3D IC structure, by a suitable bonding technology, such as wafer level packaging, wafer chip-scale packaging, or fan out wafer-level package technology. The first circuit structure 52 and the second circuit structure 56 are electrically coupled into an integrated circuit by a suitable technology, such as hybrid bonding layer, through-semiconductor via (TSV), other suitable coupling technologies, or a combination thereof.

Particularly, the substrate (first substrate 54 or the second substrate 58) may include a semiconductor substrate, such as a silicon substrate. The semiconductor substrate may alternatively include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate (54 or 58) may also include a semiconductor-on-insulator substrate, such as Si-on-insulator (SOI), SiGe-on-insulator (SGOI), Ge-on-insulator (GOI) substrates. Portions of the substrate may be doped, such as doped with p-type dopants (e.g., boron (B) or boron fluoride ($BF_3$)), or doped with n-type dopants (e.g., phosphorus (P) or arsenic (As)). The doped portions may also be doped with combinations of p-type and n-type dopants (e.g., to form a p-type well and an adjacent n-type well). The doped portions may be formed directly on the substrate, in a p-well structure, in an n-well structure, in a dual-well structure, or using a raised structure.

The first and second substrates 54 and 58 each include a frontside surface and a backside surface spanning along X and Y directions with a normal direction along Z direction. The X, Y and Z directions are perpendicular with each other. The first circuit structure 52 and the second circuit structure 56 are bonded together through the frontside surface of the first substrate 54 to the frontside surface of the second substrate 58, the frontside surface of the first substrate 54 to the backside surface of the second substrate 58, hybrid bonding layer, an interposer, or other configurations, depending on individual applications.

The first circuit structure 52 includes various devices 60 formed on the first substrate 54. The devices 60 include FETs, FinFETs, GAA devices, other multi-gate devices or a combination thereof. The first circuit structure 52 further includes an interconnect structure 62 coupling the devices 60 into a first circuit, such as a digital circuit, memory circuit, analog circuit, or a combination thereof.

The second circuit structure 56 includes various devices 63 formed on the second substrate 58. The devices 63 may include various devices, such as high-frequency devices, imaging sensor circuit, passive devices (e.g., capacitors and inductors), micro-electromechanical systems (MEMS) devices, or a combination thereof. The second circuit structure 56 further includes an interconnect structure 66 coupling the devices 63 into a second circuit, which is coupled with the first circuit formed on the first substrate 54. Particularly, the devices 63 formed in the second circuit structure 56 include one or more deep trench capacitor (DTC) 64.

A deep trench capacitor 64 includes a plurality of conductive material layers and dielectric material layers alternatively stacked and folded into one or more deep trenches to increase capacitance. The IC structure 100 including DTCs 64 and the method making the same are further described below in detail.

Figure 2:
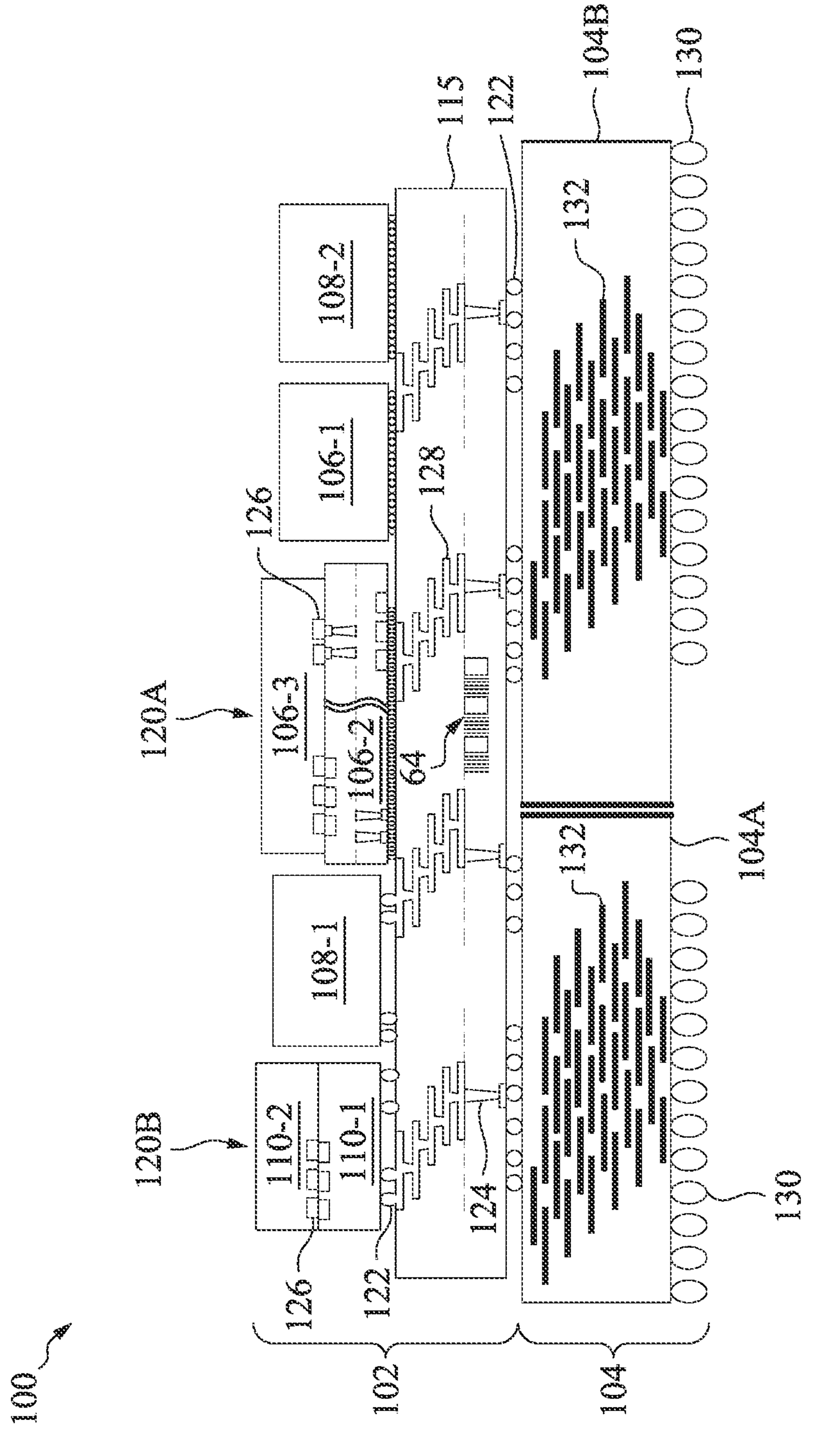
FIG. 2 is a sectional view of an IC structure having a deep trench capacitor, constructed according to some embodiments of the present disclosure.

FIG. 2 is a fragmentary cross-sectional view of the IC structure 100, in portion or entirety, that is provided by arranging a chipset using a combination of multichip packaging technologies, such as chip-on-wafer-on-substrate (CoWoS) packaging technology, system-on-integrated-chips (SoIC) multi-chip packaging technology, an integrated-fan-out (InFO) package, according to various aspects of the present disclosure. The IC structure 100, which can be referred to as a 3D IC package and/or a 3D IC module, includes a CoW structure 102 attached to a substrate 104 (e.g., a package substrate), which includes a package component 104A and a package component 104B in the depicted embodiment. CoW structure 102 includes a chipset (e.g., a core chip 106-1, a core chip 106-2, a core chip 106-3, a memory chip 108-1, a memory chip 108-2, an input/output (I/O) chip 110-1, and an I/O chip 110-2 electrically connected to each other) attached to an interposer 115. The chipset is arranged into at least one chip stack, such as a chip stack 120A and a chip stack 120B. Chip stack 120A includes core chip 106-2 and core chip 106-3, and chip stack 120B includes I/O chip 110-1 and I/O chip 110-2. In the depicted embodiment, chips of chip stack 120A and chip stack 120B are directly bonded face-to-face and/or face-to-back to provide SoIC packages of multichip package. In some embodiments, a chip stack of multichip package includes a combination of chip types, such as a core chip having one or more memory chips disposed thereover. FIG. 2 has been simplified for the sake of clarity to better understand the inventive concepts of the present disclosure. Additional features can be added in multichip package, and some of the features described below can be replaced, modified, or eliminated in other embodiments of multichip package.

Core chip 106-1, core chip 106-2, and core chip 106-3 are central processing unit (CPU) chips and/or other chips. In some embodiments, core chip 106-1 is a CPU chip that forms at least a portion of CPU cluster, and core chip 106-2 and core chip 106-3 are GPU chips. In some embodiments, core chip 106-1, core chip 106-2, core chip 106-3, or combinations thereof represent a stack of CPU dies, which can be bonded and/or encapsulated in a manner that provides a CPU package and/or a CPU-based SoIC package. In some embodiments, core chip 106-1, core chip 106-2, core chip 106-3, or combinations thereof represent a stack of dies, which can be bonded and/or encapsulated in a manner that provides a GPU package and/or a SoIC package (e.g., a GPU-based SoIC package). In some embodiments, core chip 106-1, core chip 106-2, core chip 106-3, or combinations thereof represent a stack of CPU dies, which can be bonded and/or encapsulated in a manner that provides a core package and/or a core-based SoIC package. In some embodiments, core chip 106-1, core chip 106-2, core chip 106-3, or combinations thereof are SoCs.

Memory chip 108-1 and memory chip 108-2 are high bandwidth memory (HBM) chips, GDDR memory chips, dynamic random-access memory (DRAM) chips, static random-access memory (SRAM) chips, magneto-resistive random-access memory (MRAM) chips, resistive random-access memory (RRAM) chips, other suitable memory chips, or combinations thereof. In some embodiments, memory chip 108-1 and memory chip 108-2 are HBM chips that form at least a portion of the memory device. In some embodiments, memory chip 108-1 and memory chip 108-2 are a graphics double-data rate (GDDR) memory chips that form at least a portion of the memory device. In some embodiments, memory chip 108-1 is an HBM chip and memory chip 108-2 is a GDDR memory chip, or vice versa, that form at least a portion of the memory device. In some embodiments, memory chip 108-1 and/or memory chip 108-2 represent a stack of memory dies, which can be bonded and/or encapsulated in a manner that provides a memory package and/or a memory-based SoIC package. The memory package may be an HBM package (also referred to as an HBM cube) or a GDDR memory package.

Core chip 106-1, core chip 106-2 (and thus chip stack 120A), memory chip 108-1, memory chip 108-2, and I/O chip 110-1 (and thus chip stack 120B) are attached and/or interconnected to interposer 115. Interposer 115 is attached and/or interconnected to substrate 104. Various bonding mechanisms can be implemented in multichip package, such as electrically conductive bumps 122 (e.g., metal bumps), through semiconductor vias (TSVs) 124, bonding pads 126, or combinations thereof. For example, electrically conductive bumps 122 physically and/or electrically connect core chip 106-1, core chip 106-2 (and thus chip stack 120A), memory chip 108-1, memory chip 108-2, and I/O chip 110-1 (and thus chip stack 120B) to interposer 115. Electrically conductive bumps 122 and TSVs 124 physically and/or electrically connect interposer 115 to substrate 104. TSVs 124 of interposer 115 are electrically connected to electrically conductive bumps 122 of chips and/or chip stacks of CoW structure 102 through electrically conductive routing structures (paths) 128 of interposer 115. Bonding pads 126 physically and/or electrically connect core chip 106-2 and core chip 106-3 of chip stack 120A and I/O chip 110-1 and I/O chip 110-2 of chip stack 120B. Also, dielectric bonding layers adjacent to bonding pads 126 can physically and/or electrically connect core chip 106-2 and core chip 106-3 of chip stack 120A and/or I/O chip 110-1 and I/O chip 110-2 of chip stack 120B. In some embodiments, electrically conductive bumps 122 that connect chips and/or chip stacks to interposer 115 may be microbumps, while electrically conductive bumps 122 that connect interposer 115 to substrate 104 may be controlled collapse chip connections (referred to as C4 bonds) (e.g., solder bumps and/or solder balls).

In some embodiments, substrate 104 is a package substrate, such as coreless substrate or a substrate with a core, that may be physically and/or electrically connected to another component by electrical connectors 130. Electrical connectors 130 are electrically connected to electrically conductive bumps 122 of interposer 115 through electrically conductive routing structures (paths) 132 of substrate 104. In some embodiments, package component 104A and package component 104B are portions of a single package substrate. In some embodiments, package component 104A and package component 104B are separate package substrates arranged side-by-side. In some embodiments, substrate 104 is an interposer. In some embodiments, substrate 104 is a printed circuit board (PCB).

In some embodiments, interposer 115 is a semiconductor substrate, such as a silicon wafer (which may generally be referred to as a silicon interposer). In some embodiments, interposer 115 is laminate substrate, a cored package substrate, a coreless package substrate, or the like. In some embodiments, interposer 115 can include an organic dielectric material, such as a polymer, which may include polyimide, polybenzoxazole (PBO), benzocyclobutene (BCB), other suitable polymer-based material, or combinations thereof. In some embodiments, redistribution lines (layers) (RDLs) can be formed in interposer 115, such as within the organic dielectric material(s) of interposer 115. RDLs may form a portion of electrically conductive routing structures 128 of interposer 115. In some embodiments, RDLs electrically connect bond pads on one side of interposer 115 (e.g., top side of interposer 115 having chipset attached thereto) to bond pads on another side of interposer 115 (e.g., bottom side of interposer 115 attached to substrate 104). In some embodiments, RDLs electrically connect bond pads on the top side of interposer 115, which may electrically connect chips of the chipset. In the disclosed embodiment, one or more a deep trench capacitor 64 may be embedded in interposer 115.

In some embodiments, multichip package can be configured as a 2.5D IC package and/or a 2.5D IC module by rearranging the chipset, such that each chip is bonded and/or attached to interposer 115. In other words, the 2.5D IC module does not include a chip stack, such as chip stack 120A and chip stack 120B, and chips of the chipset are arranged in a single plane. In such embodiments, core chip 106-3 and I/O chip 110-2 are electrically and/or physically connected to interposer by electrically conductive bumps 122.

Figure 3:
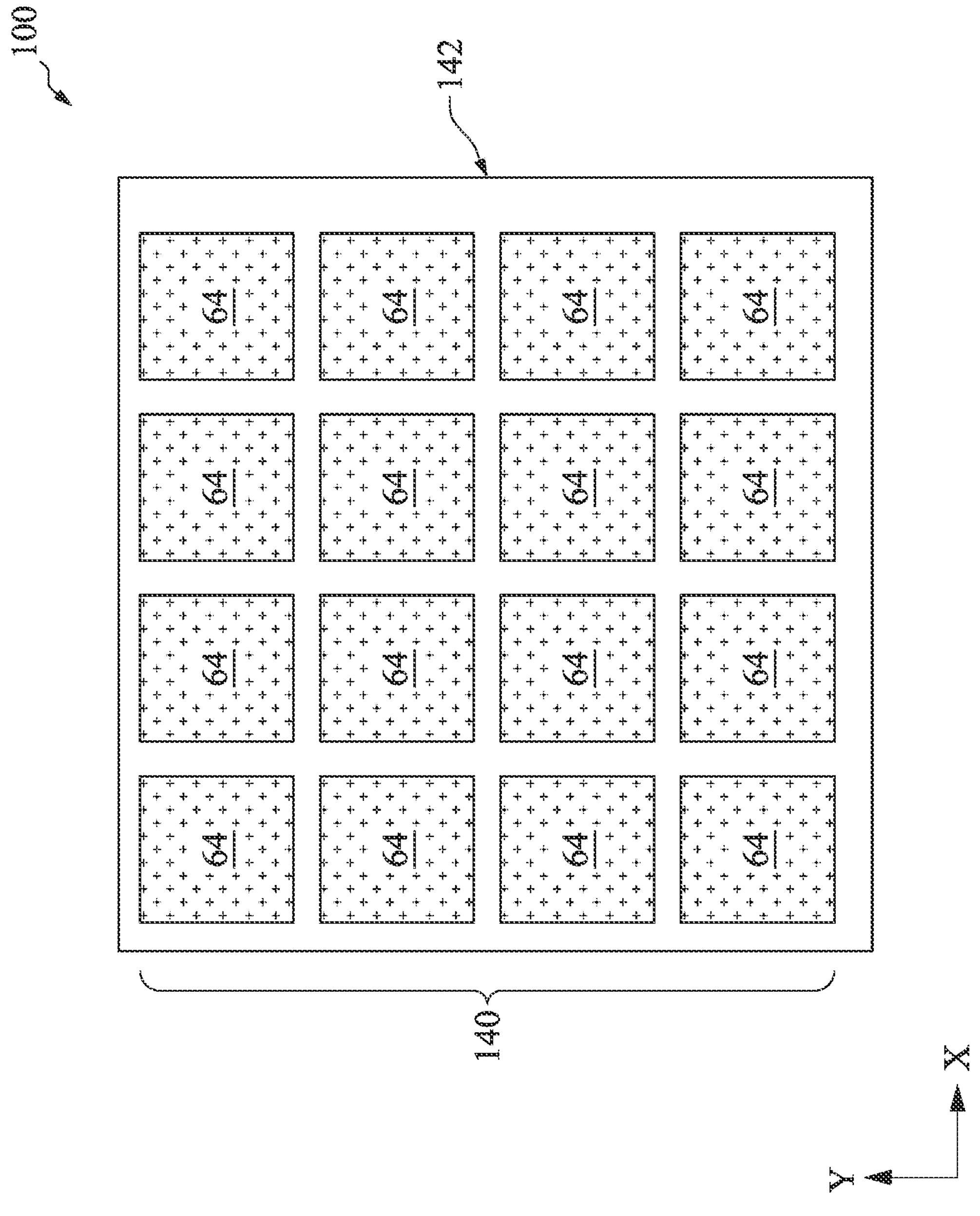
FIG. 3 is a top view of an array of deep trench capacitors, constructed according to some embodiments of the present disclosure.

FIG. 3 is a fragmentary top view of the IC structure 100, in portion or entirety, constructed in accordance with some embodiments of the present disclosure. Particularly, the IC structure 100 includes a plurality of deep trench capacitors 64 configured in an array 140, such as a two-dimensional array. Deep trench capacitors 64 are formed on a substrate 142, such as a semiconductor substrate. The structure of the deep trench capacitors 64 and the method making the same are further described below with other figures.

Figure 4A:
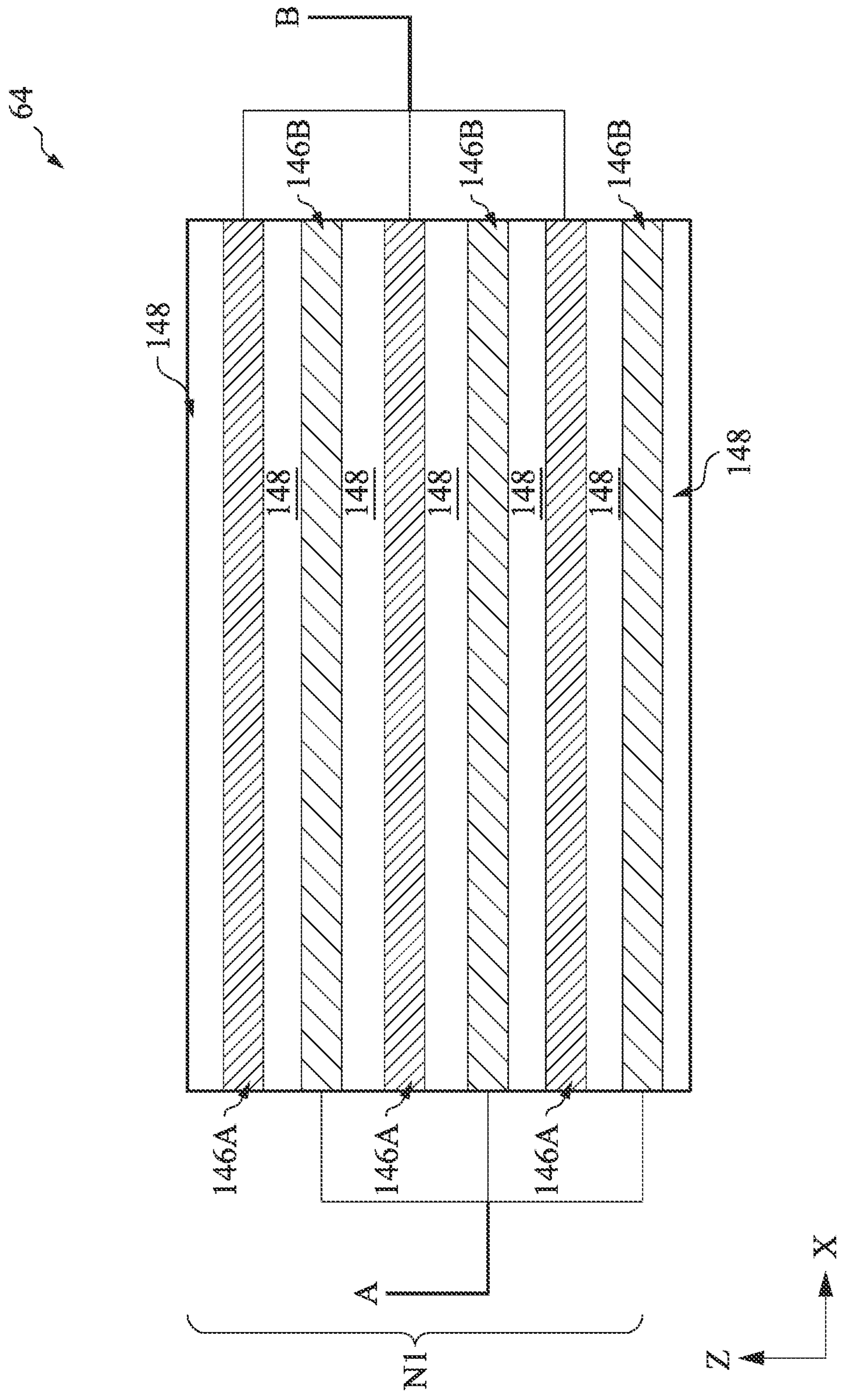
FIG. 4A is a schematic view of a deep trench capacitor, constructed according to some embodiments of the present disclosure.
Figure 4B:
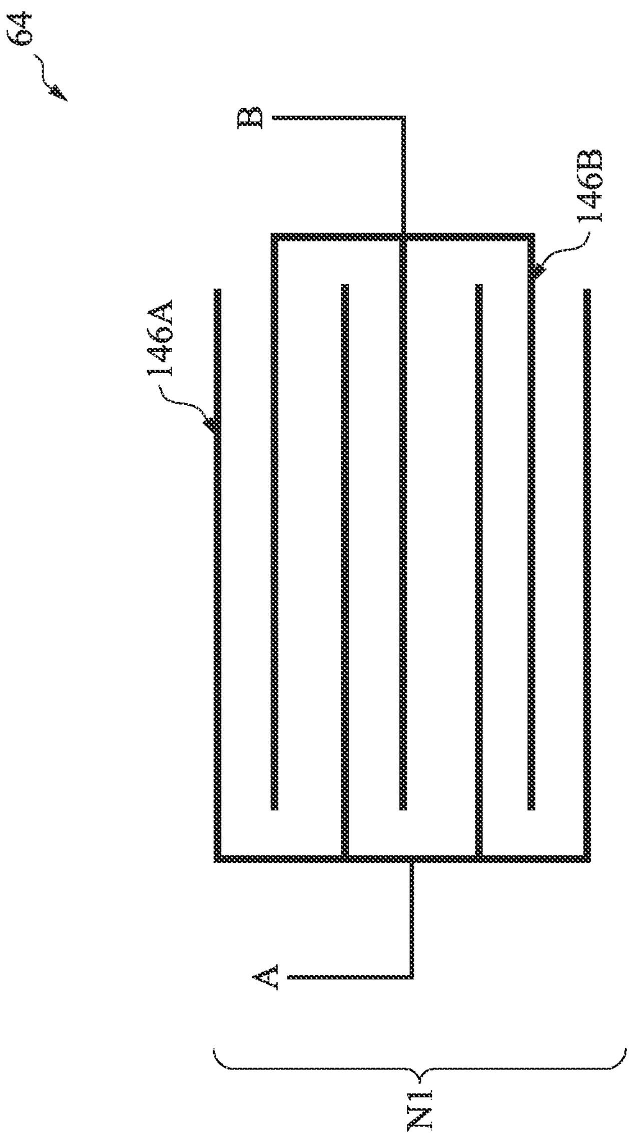
FIG. 4B is a schematic view of a deep trench capacitor, constructed according to some embodiments of the present disclosure.

FIG. 4A is a fragmentary sectional view of the IC structure 100, in portion or entirety, constructed in accordance with some embodiments of the present disclosure. Particularly, one deep trench capacitor 64 is illustrated. The deep trench capacitor 64 includes a stack of a plurality of conductive layers 146 and a plurality of dielectric layers 148 alternatively stacked to form an interleaved capacitor. FIG. 4B further illustrates a schematic view of an interleaved capacitor 64. The conductive layers 146 are grouped into first conductive layers 146A and second conductive layers 146B. The first conductive layers 146A are connected to form a first electrode A and the second conductive layers 146B are connected to form a second electrode B. The first electrode A and the second conductive layers 146B are interleaved. If the number of conductive layers 146, including 146A and 146B, is N1, the total capacitance of the interleaved capacitor 64 is $C=\varepsilon A/d\,(N1-1)$, in which ε is the permittivity of the dielectric layers 148; A is the area of each conductive layer 146; and d is the distance of the adjacent conductive layers or thickness of one dielectric layer 148. From the above formula, increasing the permittivity of the dielectric layers 148 and increasing the areas of the conductive layers 146 effectively increase the capacitance of the interleaved capacitor 64. As stated above, to increase the capacitance of the interleaved capacitor 64, one or more high-k dielectric material is employed to form the dielectric layers 148. To further increase the capacitance of the interleaved capacitor 64, the stack of the conductive layers 146 and the dielectric layers 148 are folded into deep trenches to increase the areas of the conductive layers 146 without increasing the packing area of the capacitor 64 on the substrate 142, which will be further described later.

The conductive layers 146 function as electrodes and include metal, metal alloy, silicide, other conductive material, or a combination thereof. In some embodiments, the conductive layers 146 includes titanium nitride (TiN), deposited physical vapor deposition (PVD), other suitable deposition method or a combination thereof. The dielectric layers 148 function as dielectric medium of the capacitor and include high-k dielectric material, low-k dielectric material, silicon oxide, silicon nitride, silicon oxynitride, or a combination thereof. In the disclosed embodiment, the dielectric layers 148 include a high-k dielectric material. A high-k dielectric material is a dielectric material with a dielectric constant greater than that of the thermal silicon oxide. In various embodiments, the high-k dielectric material includes metal oxides, metal nitrides, metal silicates, transition metal-oxides, transition metal-nitrides, transition metal-silicates, oxynitrides of metals. In furtherance of the embodiments, the high-k dielectric material includes metal aluminates, zirconium silicate, zirconium aluminate, $HfO_2$, $ZrO_2$, $ZrO_xN_y$, $HfO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaALO_3$, $PbTiO_3$, $BaTiO_3$, $SrTiO_3$, $PbZrO_3$, other suitable high-k dielectric material or a combination thereof. In various examples, the method to form a high-k dielectric material film includes chemical vapor phase deposition (CVD), metal organic chemical vapor phase deposition (MOCVD), PVD, atomic layer deposition (ALD), molecular beam epitaxy (MBE), other suitable technique, or a combination thereof. In another example, the high-k dielectric material may be formed by UV-Ozone Oxidation, which includes sputtering metal film; and oxidation by in-situ of metal film by O2 in presence of UV light.

Figure 5:
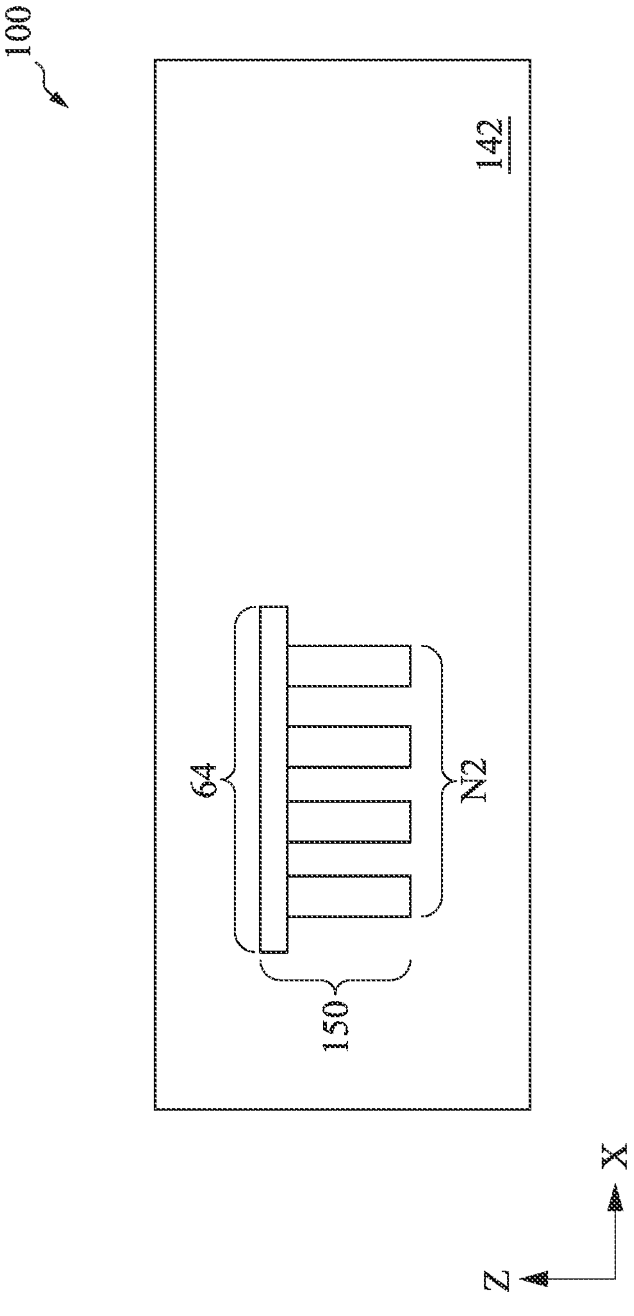
FIG. 5 is a sectional view of a deep trench capacitor, constructed according to some embodiments of the present disclosure.

FIG. 5 is a fragmentary sectional view of the IC structure 100, in portion or entirety, constructed in accordance with some embodiments of the present disclosure. Particularly, one interleaved capacitor 64 is illustrated. The stack of the conductive layers 146 and the dielectric layers 148 are folded and inserted into a number of deep trenches 150. Accordingly, the capacitor 64 is also referred to as deep trench capacitor (DTC) 64. The number of the trenches occupied by the capacitor 64 is N2. Increasing N1, N2 or both will increase the capacitance of the capacitor 64.

Figure 6A:
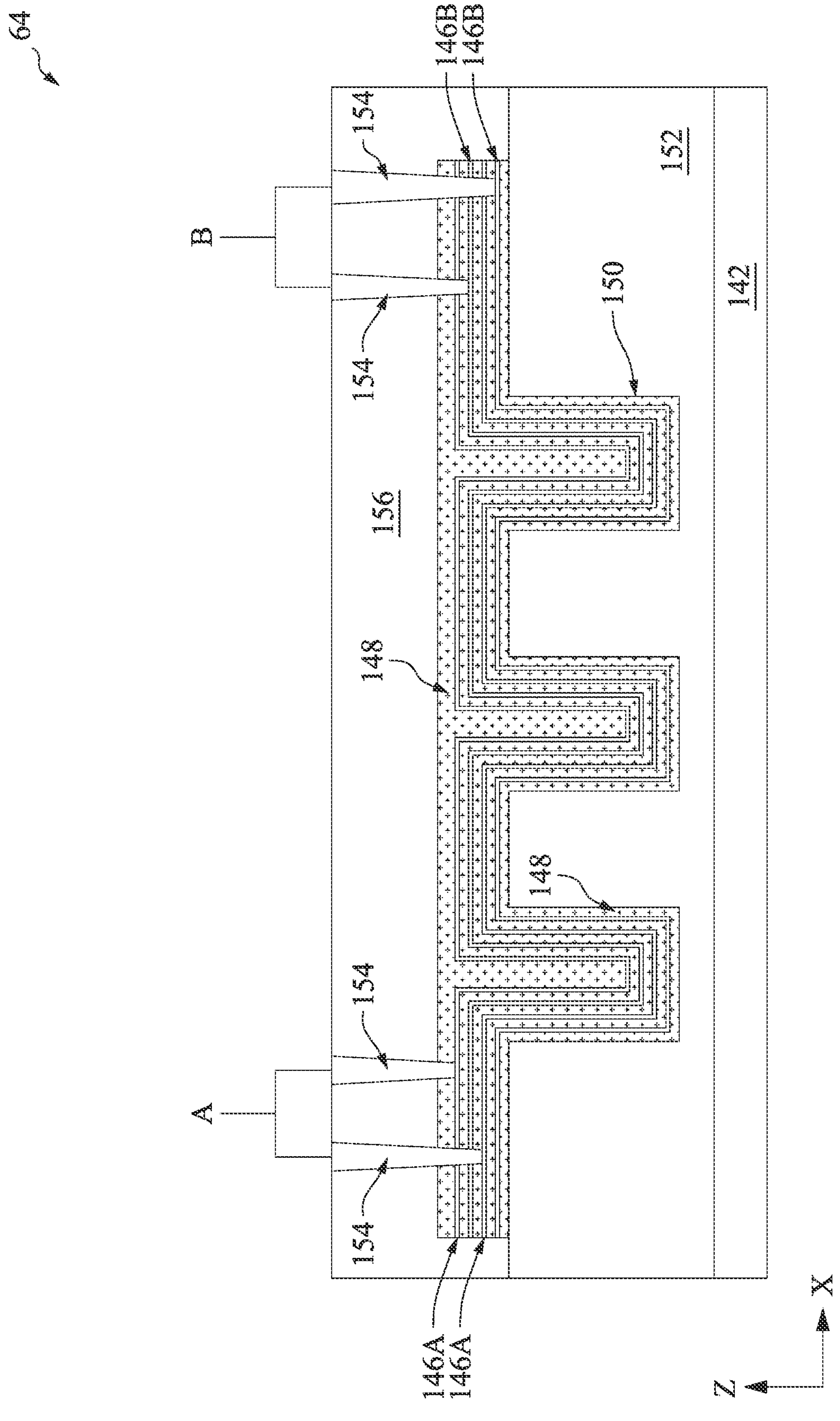
FIGS. 6A, 6B, 6C and 6D are sectional views of a deep trench capacitor, constructed at various fabrication stages according to various embodiments of the present disclosure.

FIG. 6A is a fragmentary sectional view of the IC structure 100, in portion or entirety, constructed in accordance with some embodiments of the present disclosure. Particularly, one deep trench capacitor 64 is illustrated. The stack of the conductive layers 146 and the dielectric layers 148 are folded and inserted into deep trenches 150. In the illustrated embodiment, the DTC 64 includes four conductive layers 146 and is formed in three deep trenches 150, in which case, N1=4 and N2=3. It is understood that N1 and N2 can be any suitable integers within the scope of the present disclosure.

Specifically, the DTC 64 is formed on a substrate 142, such as a semiconductor substrate and may further include one or more dielectric material layer 152, such as an interlayer dielectric (ILD) layer deposited on the substrate 142. The dielectric material layer 152 may include silicon oxide, silicon nitride, low k dielectric material, other suitable dielectric material or a combination thereof.

Figure 6B:
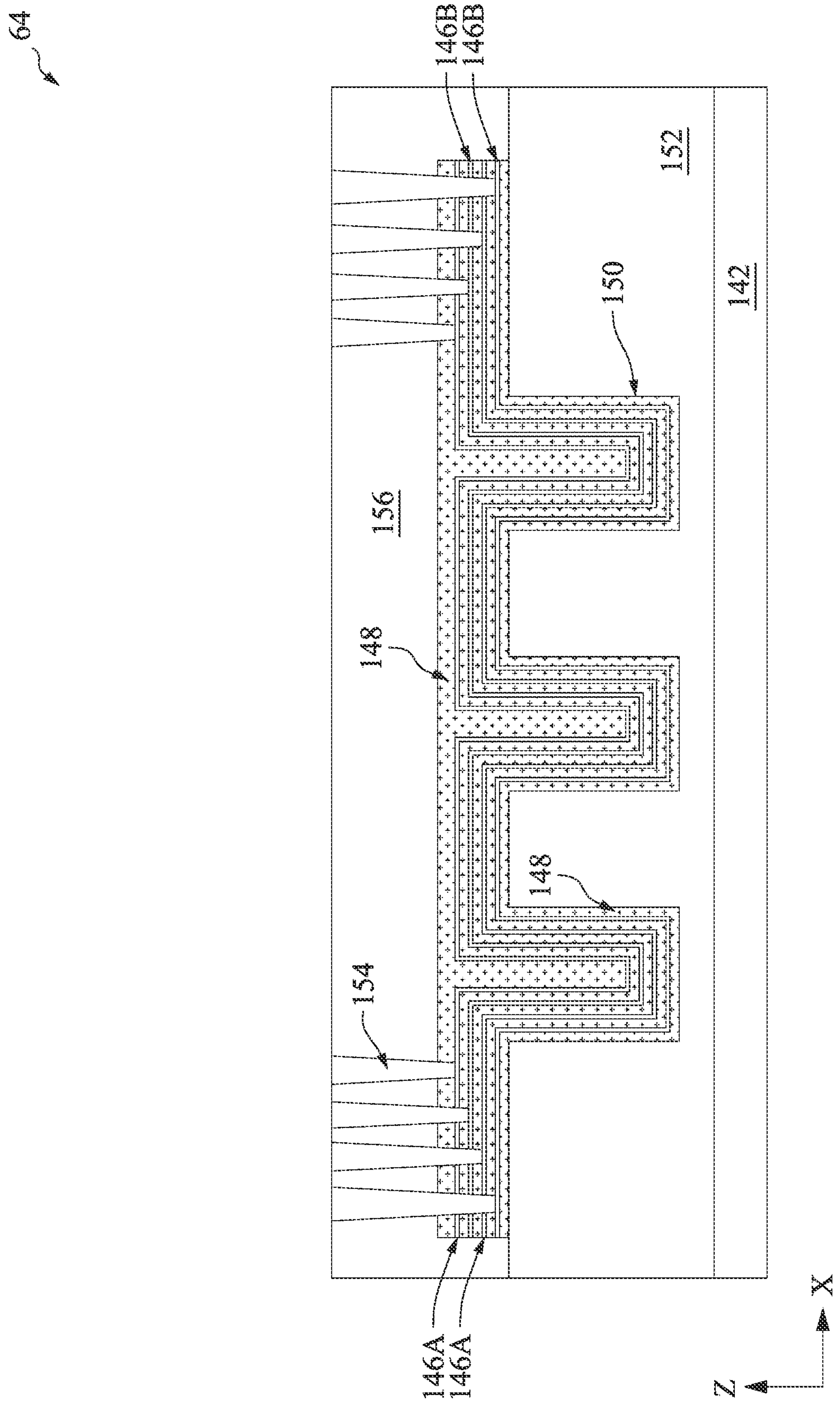
Figure 6C:
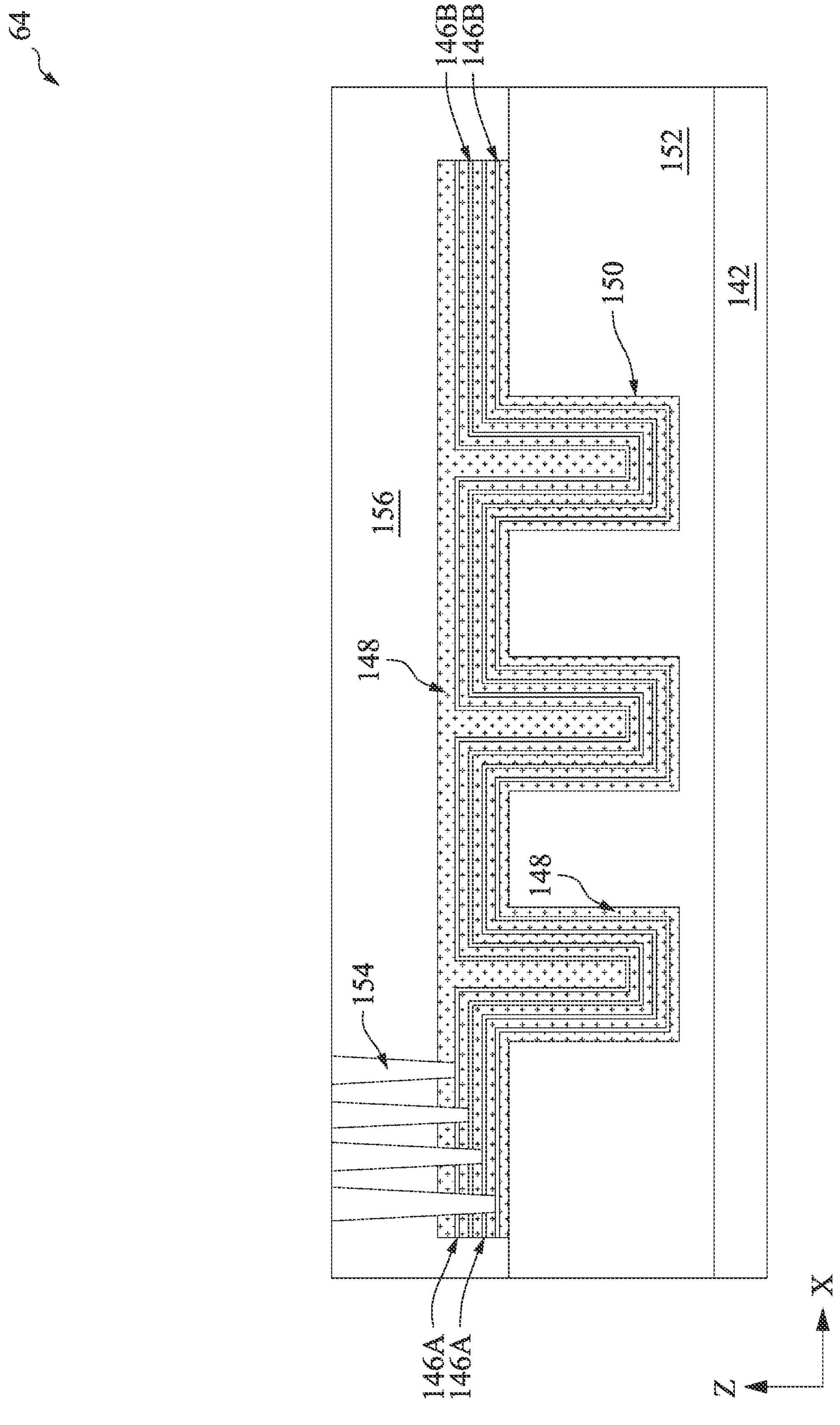
Figure 6D:
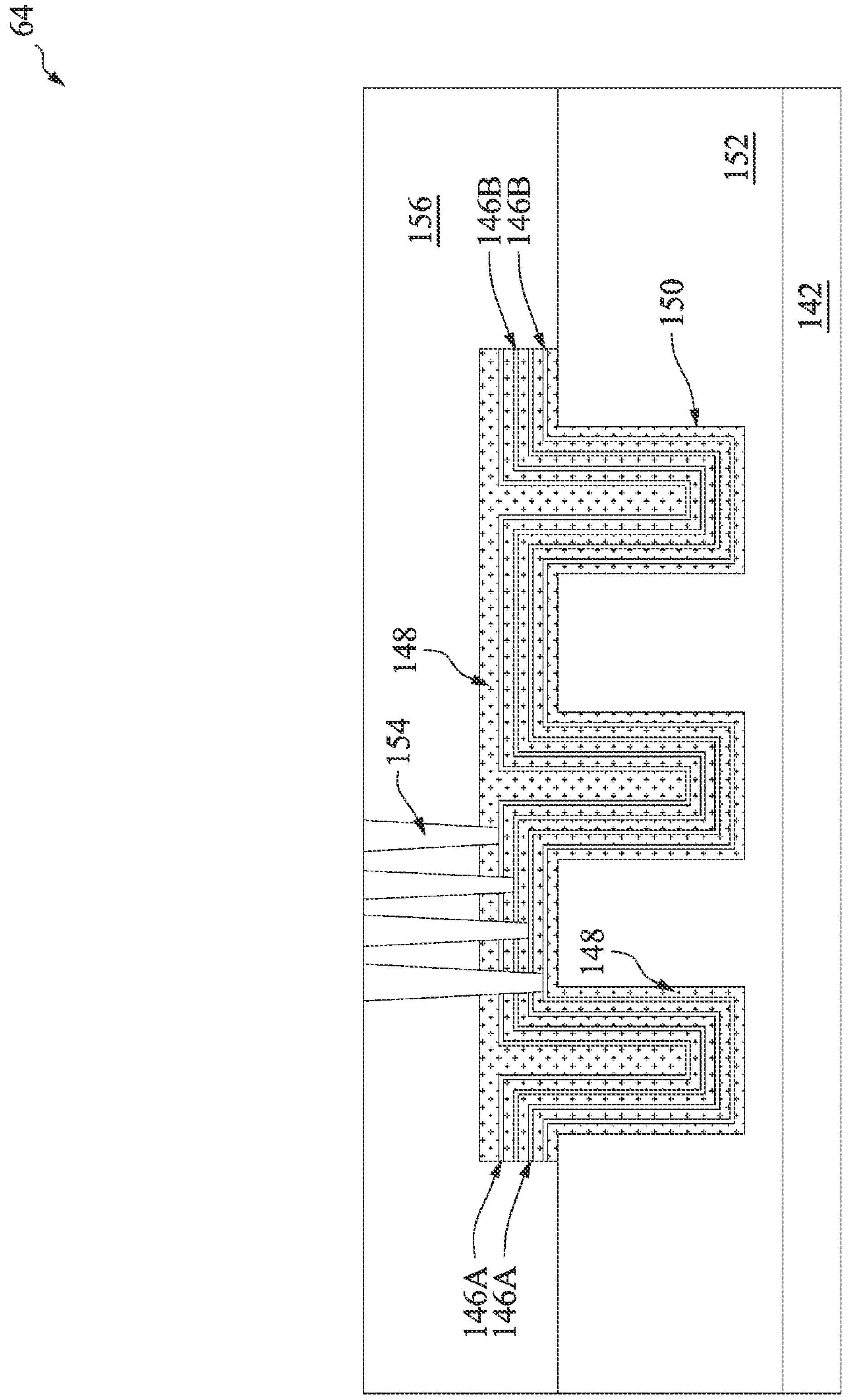

The stack of the conductive layers 146 and the dielectric layers 148 are folded and inserted into deep trenches 150 and is further extended above the trenches, such as over the dielectric material layer 152. The stack is further patterned by lithography process and etch so that the DTC 64 is constrained in a local DTC cell area without interference with adjacent DTC cells. The conductive plugs 154 are formed in another dielectric material layer 156 and are landing on respective conductive layers 146 including 146A and 146B. The conductive plugs landing the conductive layers 146A are electrically connected, such as through an interconnect structure, to form the first electrode A and the conductive plugs landing the conductive layers 146B are electrically connected to form the second electrode B. The dielectric material layer 156 may include silicon oxide, silicon nitride, low k dielectric material, other suitable dielectric material or a combination thereof. In the disclosed embodiment, the dielectric material layer 156 includes undoped silica glass (USG) deposited by CVD, other suitable deposition or a combination thereof. The conductive plugs 154 include aluminum, copper, tungsten, other suitable metal, metal alloy or a combination thereof. In the disclosed method, the conductive plugs 154 include multiple conductive layers designed to address various issues. Especially, a dielectric material layer is surrounding sidewalls of each conductive plug 154 so to provide isolation from intervening conductive layers 146. The conductive plugs 154 may have different configurations, such as landing on the extended stack on both sides as illustrated in FIG. 6B, landing on the extended stack on one side as illustrated in FIG. 6C, landing on the extended stack between two adjacent deep trenches 150 as illustrated in FIG. 6D, or other configurations, such as a subset landing on the extended stack between the deep trenches and another subset landing on the extended stack on either side or both sides. The DTC 64 may include other features, such as one or more dielectric material with respective compositions formed in different configuration, such as one additional dielectric layer formed in the deep trenches 150.

Figure 7A:
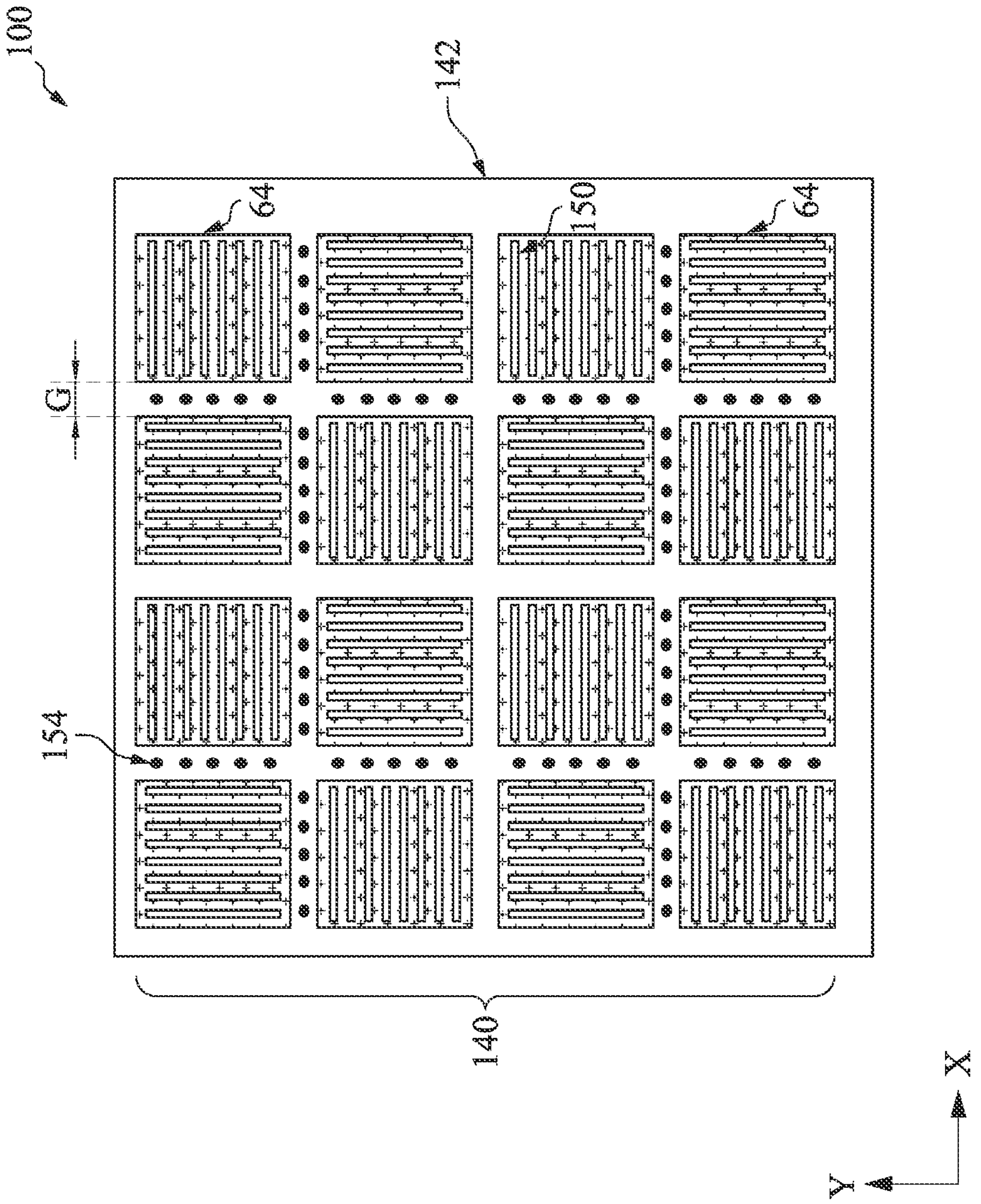
FIGS. 7A, 7B, 7C, 7D and 7E are top views of an array of deep trench capacitors, constructed according to various embodiments of the present disclosure.
Figure 7B:
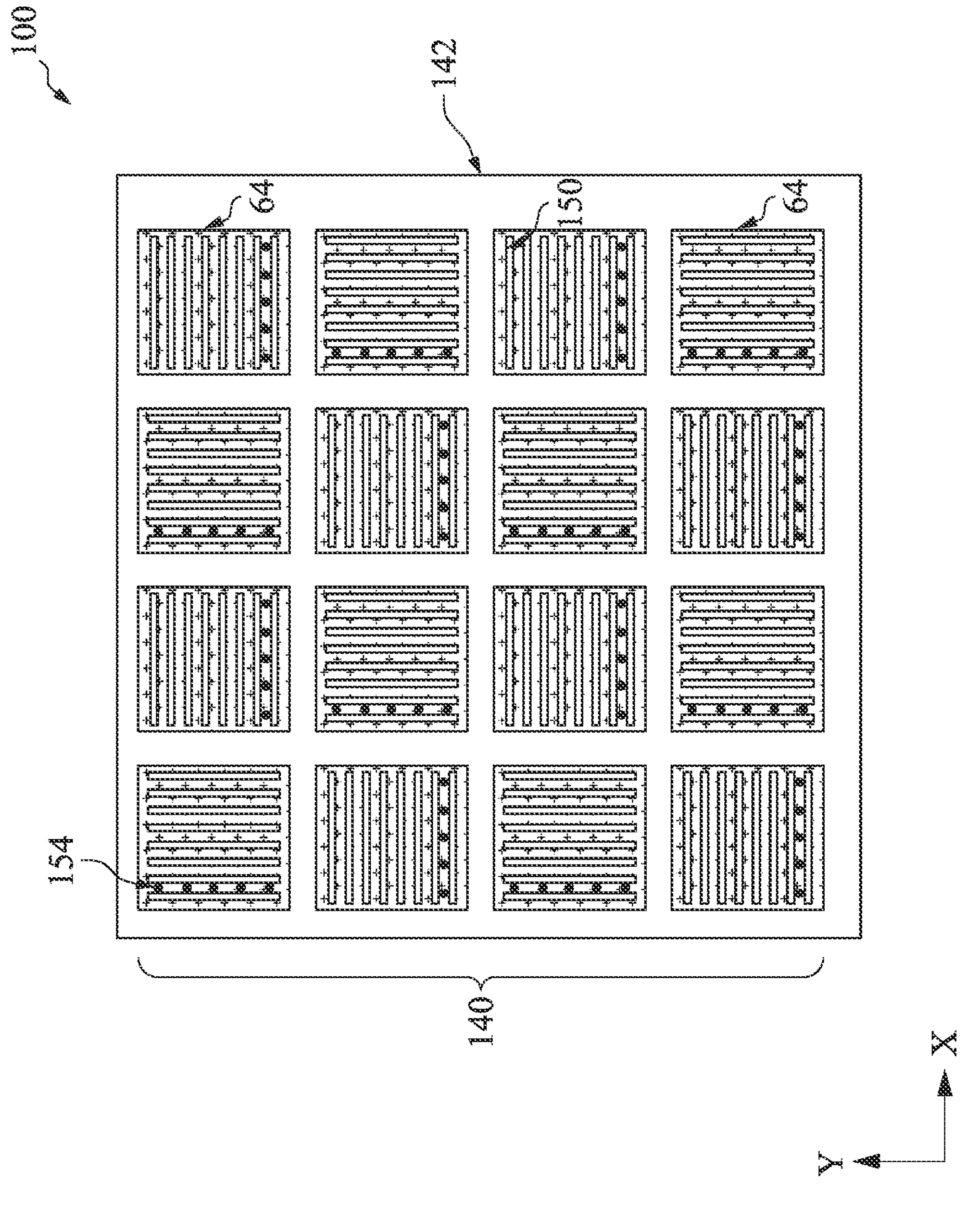
Figure 7C:
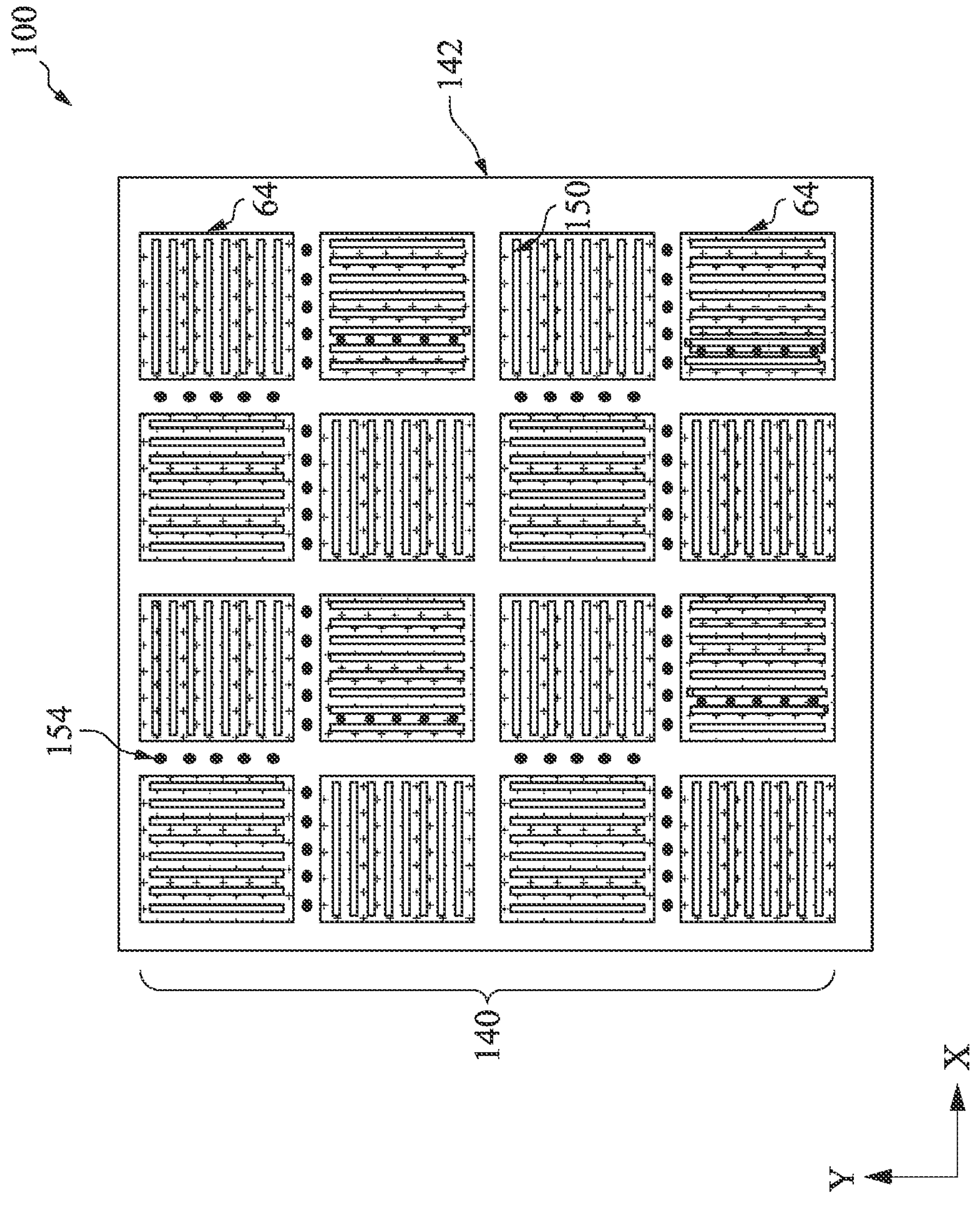
Figure 7D:
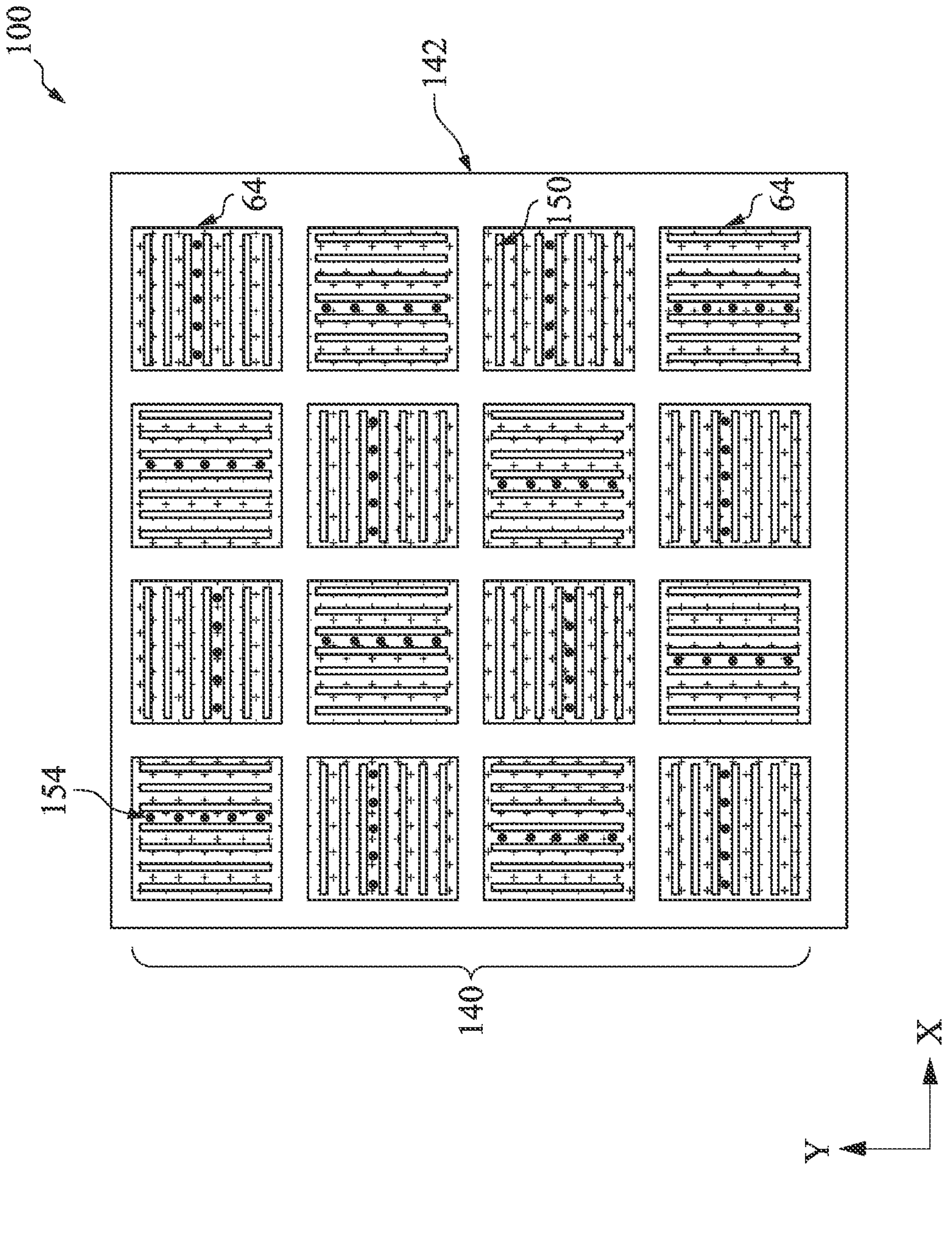
Figure 7E:
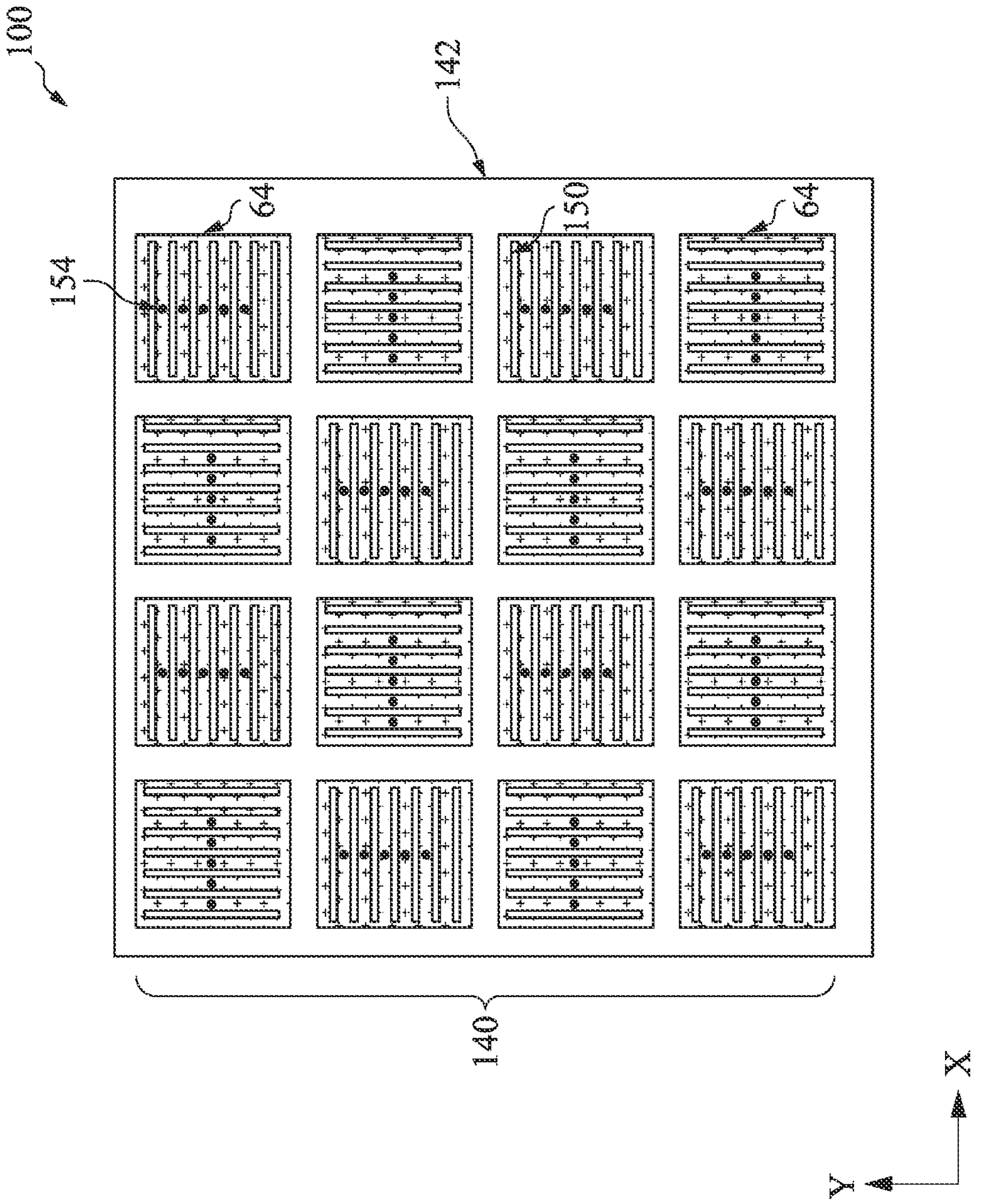

FIGS. 7A-7E are fragmentary top views of the IC structure 100, in portion or entirety, constructed in accordance with some embodiments of the present disclosure. Especially, the array 140 of DTCs 64 are illustrated. As shown in FIG. 7A, the deep trenches 150 of the DTCs 64 are configured in a way such that the deep trenches 150 in the adjacent DTCs 64 are oriented along different directions so to reduce the stress. For example, the deep trenches 150 in one DTC 64 are longitudinally oriented along X direction and the deep trenches 150 in an adjacent DTC 64 are longitudinally oriented along Y direction. The conductive plugs 154 are placed in various configurations, as described in FIGS. 6A-6D. In FIG. 7A, the conductive plugs 154 for each DTC 64 are formed on the extended stack on one side. In FIG. 7B, the conductive plugs 154 for each DTC 64 are formed on the extended stack between adjacent deep trenches 150. In FIG. 7C, the conductive plugs 154 for each DTC 64 are either formed on the extended stack on one side or are formed on the extended stack between adjacent deep trenches 150. In FIG. 7D, the conductive plugs 154 for each DTC 64 are formed on the extended stack between adjacent deep trenches 150 but at different locations. In FIG. 7E, the conductive plugs 154 for each DTC 64 are distributed on the extended stack among adjacent deep trenches 150. Especially, as explained later, due to the disclosed structure and the method making the same, the diameter of the conductive plugs 154 can be controlled less than 100 A, such as about 30 A. Accordingly, the gap G between adjacent DTCs 64 can be controlled to a small amount, such as 100 A.

The formation of the DTC 64 is further described with reference to FIGS. 8A through 8E and 9A through 9C. FIGS. 8A through 8E are fragmentary sectional views of a DTC 64 at various fabrication stages, in portion or entirety, constructed in accordance with some embodiments of the present disclosure. FIGS. 9A through 9C are fragmentary sectional views of a conductive plug 154 at various fabrication stages, in portion or entirety, constructed in accordance with some embodiments of the present disclosure.

Figure 8A:
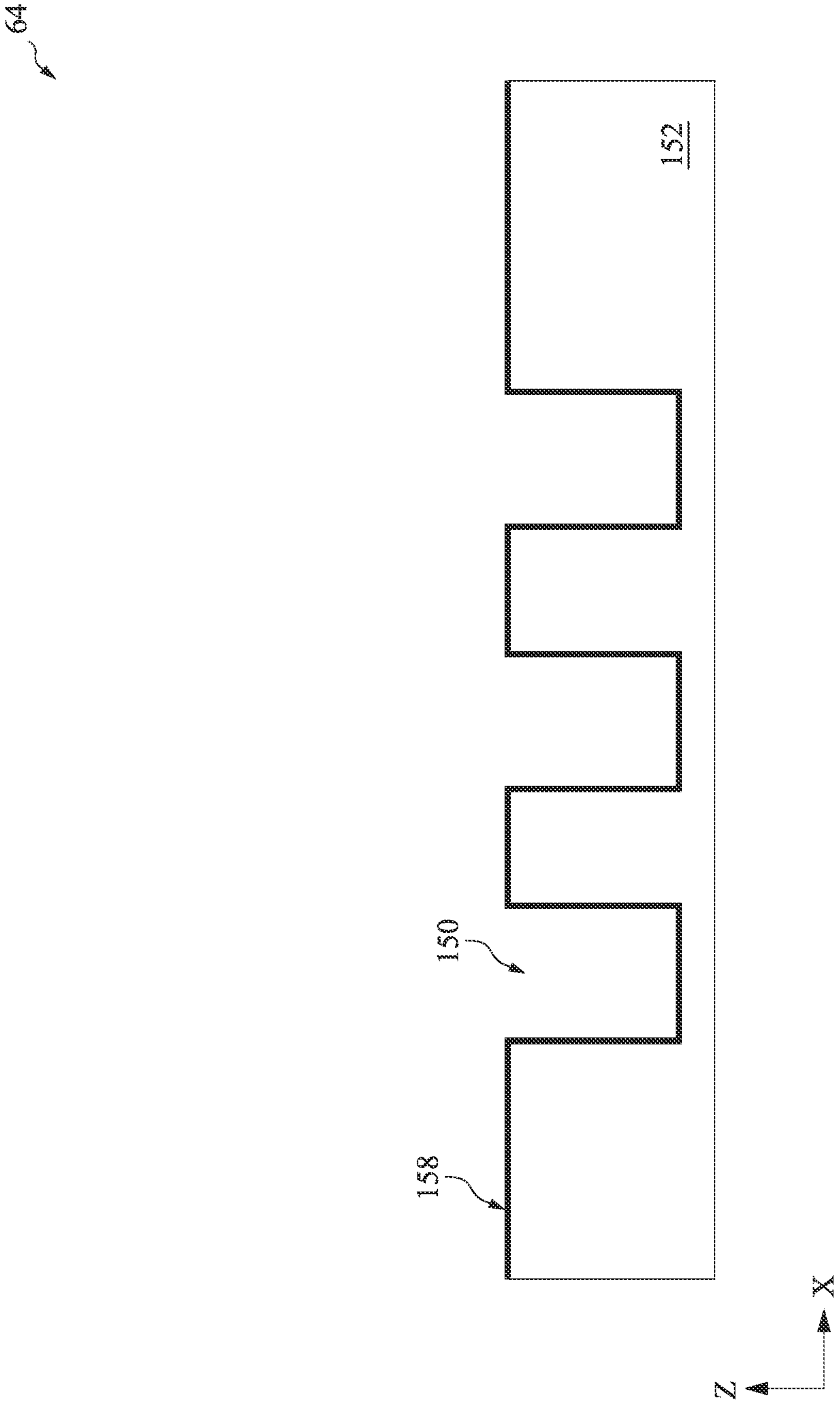
FIGS. 8A, 8B, 8C, 8D and 8E are sectional views of a deep trench capacitor at various fabrication stages, constructed at various fabrication stages according to various embodiments of the present disclosure.

Referring to FIG. 8A, the dielectric material layer 152 is patterned to form deep trenches 150 by a lithography process and etch. A dielectric layer 158 may be further deposited in the deep trenches 150 by a suitable method, such as CVD. The dielectric layer 158 may include one or more dielectric material, such as USG, with proper thickness.

Figure 8B:
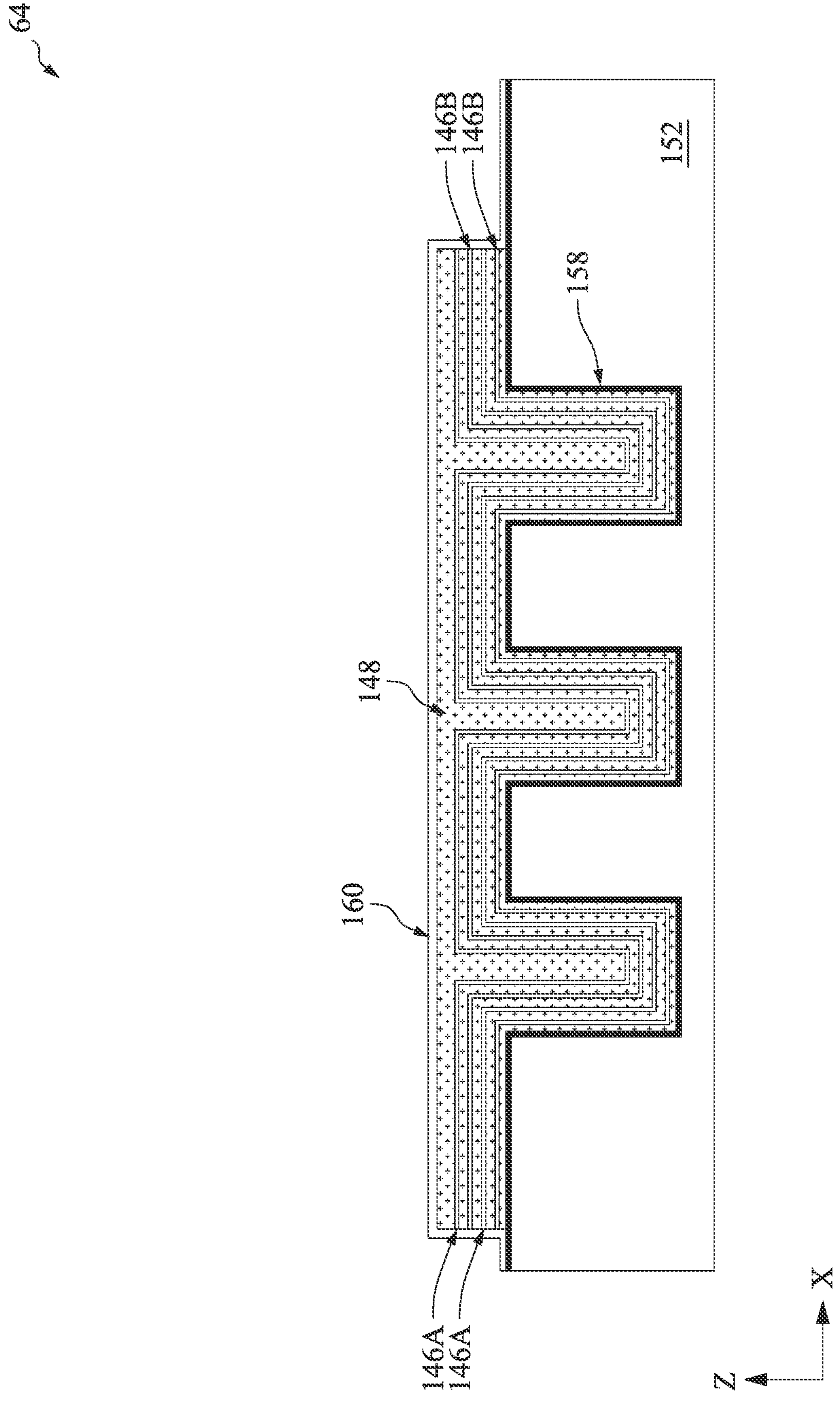

Referring to FIG. 8B, the stacks of the conductive layers 146 and the dielectric layers 148 are sequentially deposited in the deep trenches 150 and on the dielectric material layer 152. The stack is further patterned such that the stack of the conductive layers 146 and the dielectric layers 148 for one DTC is separated from that of an adjacent DTC 64. Another dielectric layer 160 is further deposited on the patterned stack and the dielectric layer 158. The dielectric layer 160 may include one or more dielectric material, such as a silicon oxide layer and a silicon nitride layer on the silicon oxide layer.

Figure 8C:
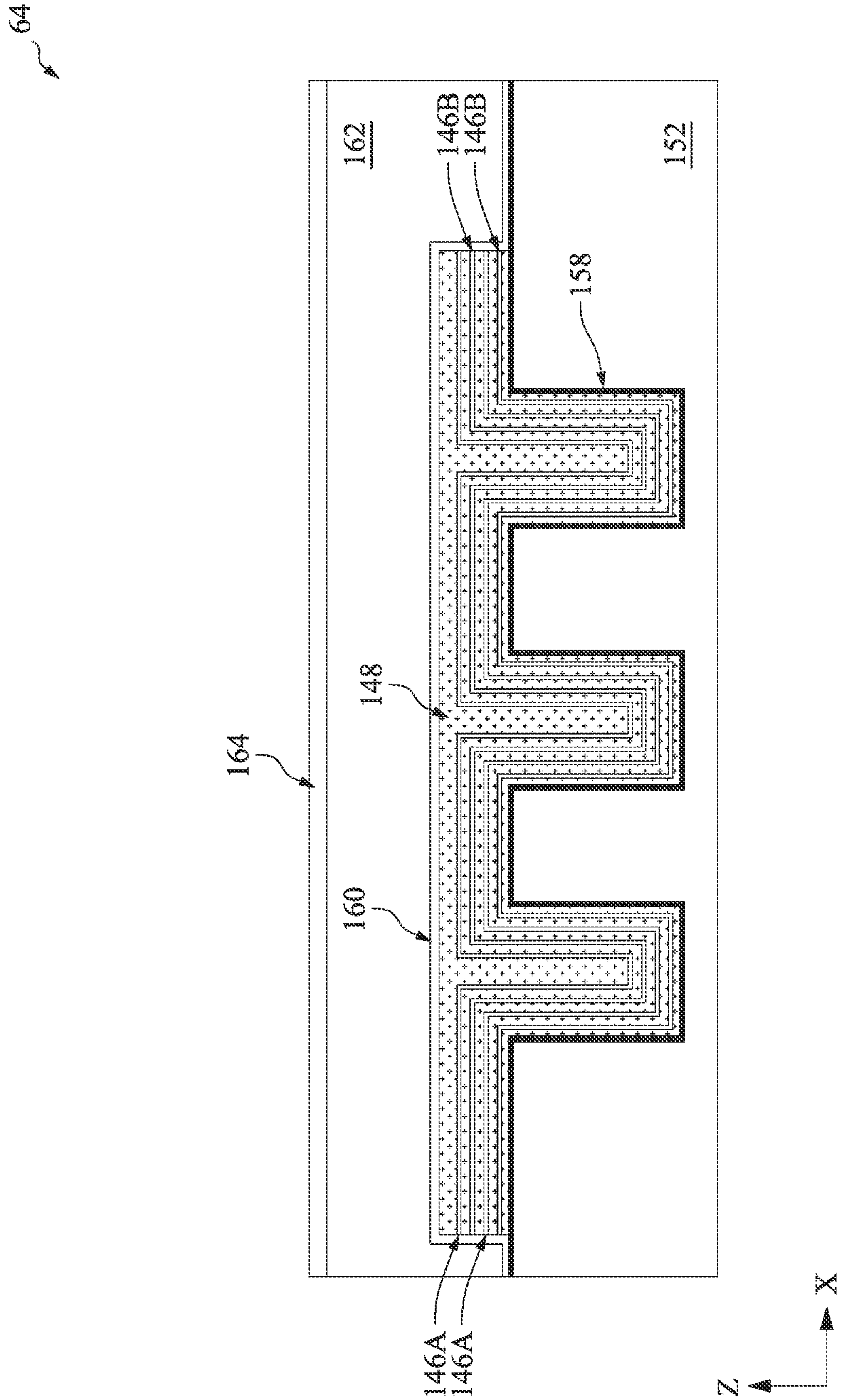

Referring to FIG. 8C, a dielectric material layer 162 is formed on the patterned stack and the dielectric layer 160. The dielectric material layer 162 may include one or more dielectric material, such as USG. The thickness of the dielectric material layer 162 is designed with consideration of the conductive plugs to be formed. In the disclosed embodiment, the thickness of the dielectric material layer 162 is less than 1 micron. The dielectric material layer 162 is formed by any suitable process, such as deposition by CVD and planarization by CMP. A hard mask 164 may be further formed on the dielectric material layer 162, used as an etch mask to pattern the dielectric material layer 162. In some embodiments, the hard mask 164 includes one or more suitable material, such as silicon oxide, silicon nitride, silicon oxynitride, other suitable dielectric material or a combination thereof. In the disclosed embodiment, the hard mask 164 includes a silicon oxynitride layer and a silicon oxide layer over the silicon oxynitride layer.

Figure 8D:
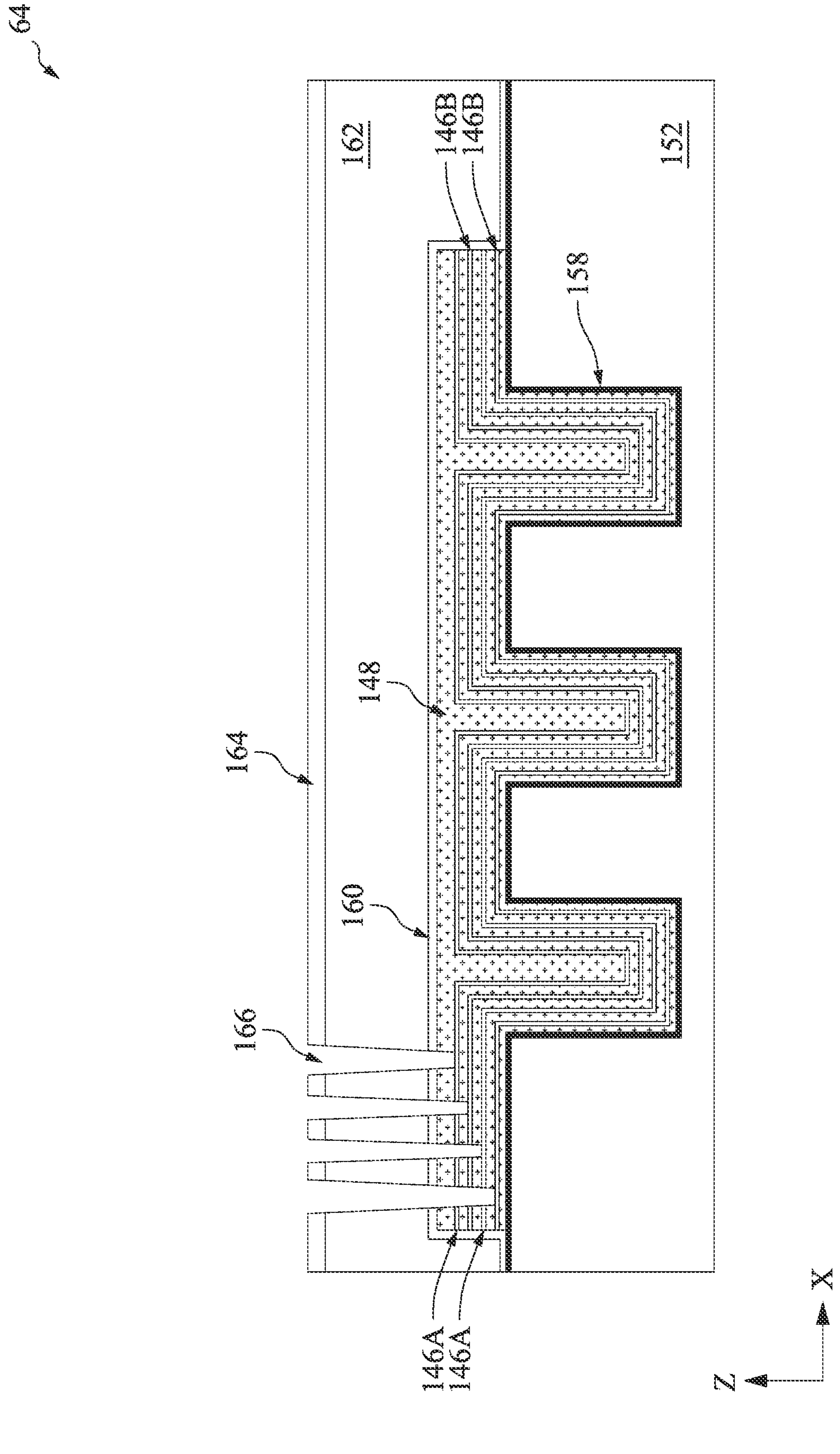

Referring to FIG. 8D, the dielectric material layer 162 is patterned to form deep via holes 166 by a lithography process and etch. The via holes 166 are designed to form the conductive plugs 154 therein. In the disclosed embodiment, the patterning process may include patterning the hard mask 164 to form openings by lithography process and etch; etching the dielectric material layer 162 using the patterned hard mask 164 as an etch mask. Particularly, since the conductive plugs 154 are landing on respective conductive layers 146 with different heights, the via holes 166 are formed with respective depths and expose respective conductive layers 146 at the bottom surfaces of the via holes 166. One method to achieve this structure, a number of the patterning processes are applied to the dielectric material layer 162 form the via holes 166. For example, if the number of the conductive layers 146 is N1 (such as 4 in the illustrated example), the number of patterning processes is N1 (such as 4 in the illustrated example). This means N1 patterning processes each further including one lithography process and one etch process. After the patterning process, the via holes 166 are formed to expose respective conductive layers 146 as illustrated in FIG. 8D.

Figure 8E:
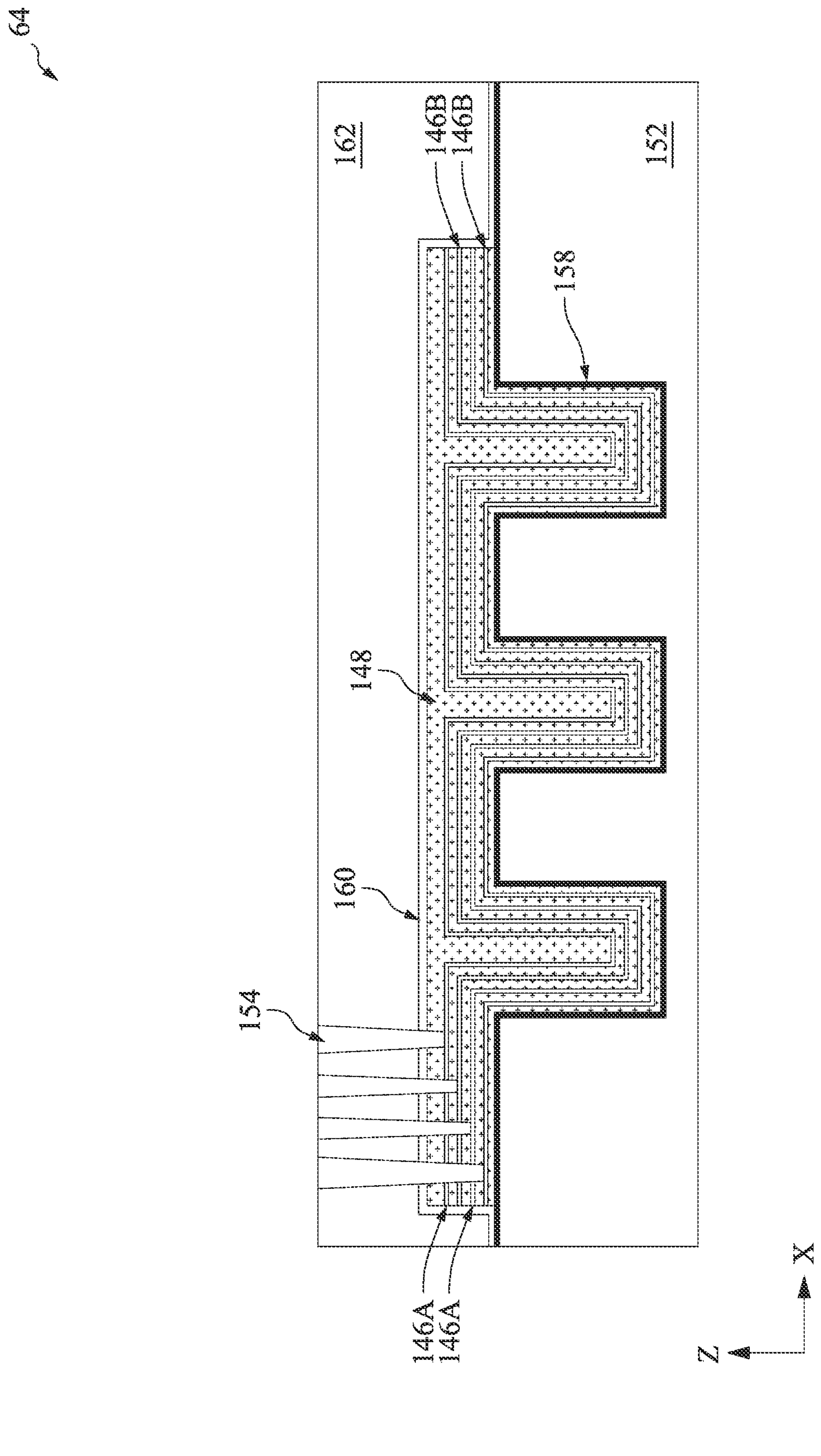

Referring to FIG. 8E, the conductive plugs 154 are formed in the via holes 166 by a suitable procedure, such as a procedure including depositions and CMP. The hard mask 164 may be removed by the CMP or an etch process before, after or during the formation of the conductive plugs 154. It is noted that each conductive plug 154 is intended to connect to desired conductive layer 146 but may have short issues to the intervening conductive layer(s) 146. Therefore, the conductive plugs 154 are designed with a dielectric material surrounding sidewalls thereof to eliminate the short issues. The formation of the conductive plugs 154 is designed to have multiple conductive material layers to address other issues, such as peeling issues, packing density, and other issues. The formation of the conductive plugs 154 is further described in detail with reference to FIGS. 9A through 9C.

Referring to FIG. 9A, one via hole 166 is illustrated. A dielectric material layer 168 is formed on sidewalls of the via hole 166 and is absent from the bottom surface of the via hole 166. As known from the above description, the conductive layer 146 is exposed from the bottom surface of the via hole 166 and is intended to be connect to the conductive plug 154. Other conductive layers 146 above the intended conductive layer 146 are also exposed from the sidewalls of the via hole 166, those conductive layers 146 being referred to as intervening conductive layers 146. The dielectric material layer 168 can effectively prevent the short issue of the conductive plug 154 to the intervening conductive layers 146. The formation of the dielectric material layer 168 includes deposition and anisotropic etch, such as plasma etch, to remove the portions of the dielectric material layer 168 deposited on the bottom of the via hole 166. The dielectric material layer 168 includes one or more dielectric materials, such as silicon oxide, silicon nitride, other suitable dielectric material, or a combination thereof. The deposition method may include atomic layer deposition (ALD), other suitable deposition, or a combination thereof. The dielectric material layer 168 includes a thickness great enough to provide isolation function and thin enough without substantially impacting the opening dimension of the via hole 166. In the disclosed embodiment, the thickness of the dielectric material layer 168 is less than 10 A, such as ranging between 5 A and 8 A.

Referring to FIG. 9B, a first metal-containing conductive layer 170 is deposited in the via hole 166, on sidewalls and bottom surface of the via hole 166. A second metal-containing conductive layer 172 is deposited on the first metal-containing conductive layer 170 within the via hole 166. The first and second metal-containing conductive layers 170, 172 are different from each other in composition. The first and second metal-containing conductive layers 170, 172 are designed to provide integration of the conductive plugs 154 to the dielectric material layer 162, such as adhesion, without using an existing barrier layer. For the existing barrier layer, if it is too thin, the existing barrier layer cannot provide good integration and may cause the peeling issue. If it is too thick, the existing barrier layer will reduce the aspect ratio of the via hole, and reduce the fill capability, may introduce defect of the conductive plug 154, such as void.

In the disclosed embodiment, the first metal-containing conductive layer 170 includes cobalt, nickel, other suitable metal, or a combination thereof. The first metal-containing conductive layer 170 is deposited by ALD, other suitable deposition or a combination thereof. The first metal-containing conductive layer 170 may include a thickness greater than 10 A, such as ranging between 10 A and 15 A. In some embodiments, the first metal-containing conductive layer 170 may additionally or alternatively include titanium. The first metal-containing conductive layer 170 functions as a glue layer to provide adhesion of the conductive plug 154 to the dielectric material layer 162.

In the disclosed embodiment, the second metal-containing conductive layer 172 includes an alloy of copper (Cu) and manganese (Mn), referred to as CuMn. The second metal-containing conductive layer 172 is deposited by PVD, CVD, ALD, other suitable deposition or a combination thereof. The second metal-containing conductive layer 172 may include a thickness greater than 10 A, such as ranging between 10 A and 20 A. In some embodiments, the second metal-containing conductive layer 172 may additionally or alternatively include other suitable conductive material, such as titanium nitride or tantalum nitride.

Referring to FIG. 9C, a fill metal layer 174 is filled in the via hole 166, thereby forming the conductive plug 154. The fill metal layer 174 is different from the first and second metal-containing conductive layers 170, 172 in composition. The fill metal layer 174 includes aluminum (Al), aluminum copper alloy (AlCu), tungsten (W), other suitable metal, or a combination thereof. The fill metal layer 174 is filled over the first and second metal-containing conductive layers 170, 172 within the via hole 166 by a suitable process, such as hot flow process. In the hot flow process, the metal or alloy is heated to an elevated temperature so that the metal or alloy has a flowability and is deposited in the via hole 166 with enhanced filling capability and efficiency. The elevated temperature depends on individual metal or alloy. For example, if the fill metal layer is aluminum, the elevated temperature is greater than 350° C., such as ranging between 350° C. and 550° C. In furtherance of the example, the metal (such as Al) is deposited by PVD when the workpiece is heated to a reflow temperature, such as a temperature between 350° C. and 550° C. during the PVD deposition. Afterward, a CMP process may be further applied to remove excessive deposited material and planarize the top surface. By utilizing the above conductive plugs 154, the dimensions, such as a diameter, of the via holes 166 can be substantially reduced, such as from 2000 A to 30 A.

Figure 10A:
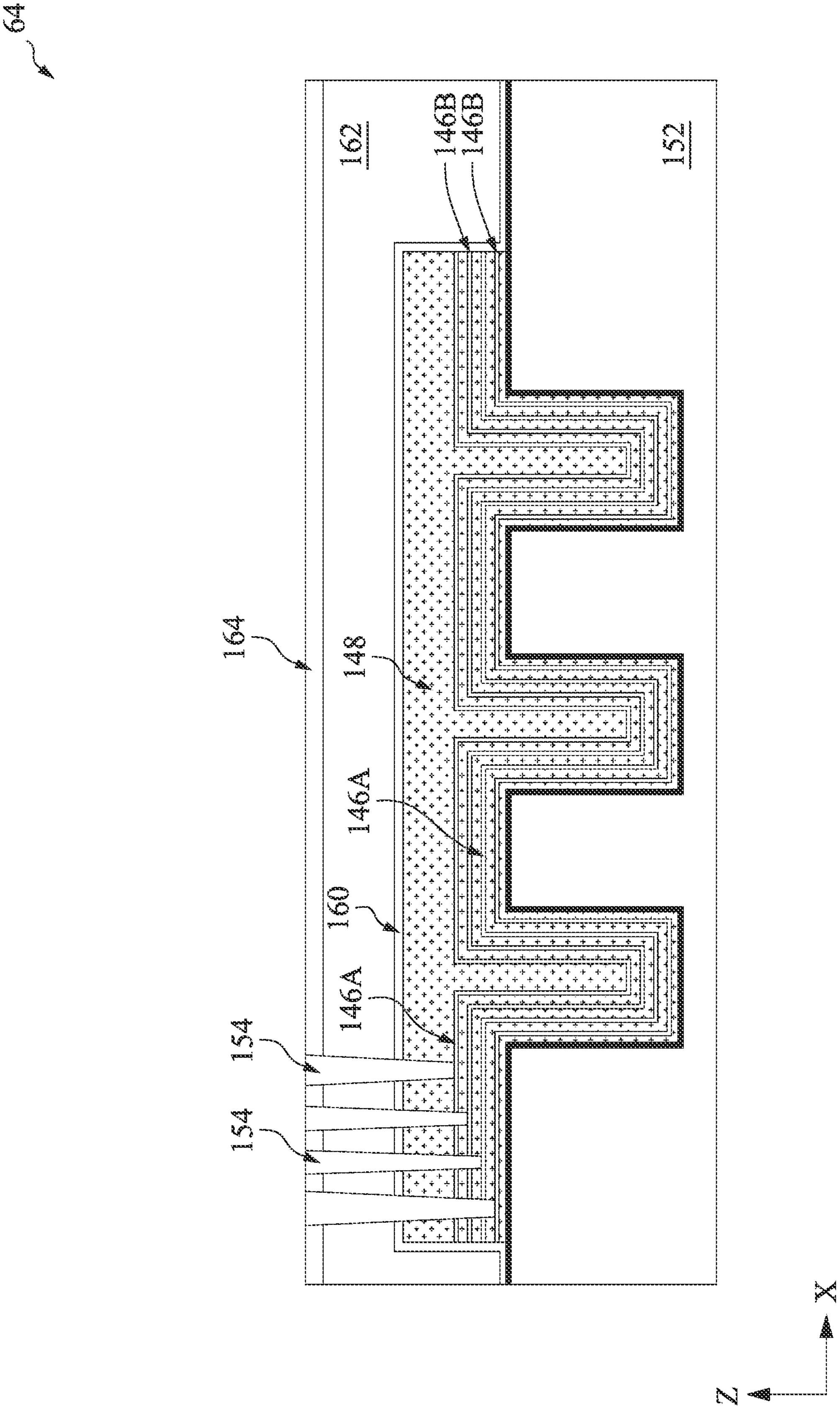
FIGS. 10A and 10B are sectional views of a deep trench capacitor, constructed at various fabrication stages according to various embodiments of the present disclosure.
Figure 10B:
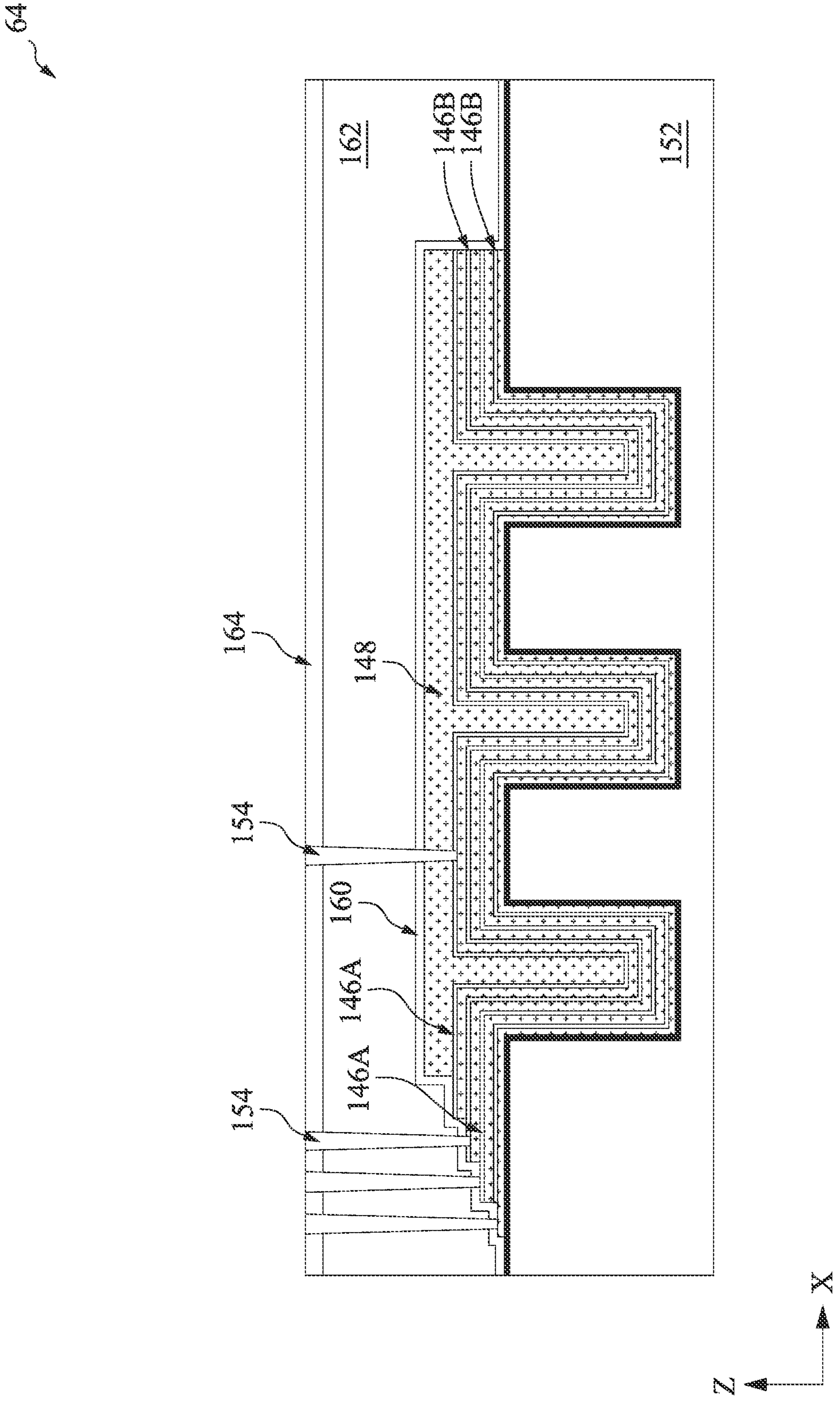

FIGS. 10A and 10B are fragmentary sectional views of a DTC 64, in portion or entirety, constructed in accordance with some embodiments of the present disclosure. The DTC 64 in FIG. 10A or 10B is similar to the DTC 64 illustrated in FIGS. 6A-6D (and FIG. 8E). The similar descriptions are not repeated here for simplicity. However, the DTC 64 in FIG. 10 is different from the DTC 64 in FIG. 8E since the stack of the conductive layers 146 and the dielectric layers 148 is patterned to form a step-wise structure. This structure can avoid the intervening conductive layers 146. Specifically, each conductive layer 146 includes a segment in one step region of the step-wise structure, wherein that segment is the topmost conductive layer in that step region. If the conductive plug 154 connecting to that conductive layer 146 is formed within that step region, the short issue to the intervening conductive layers 146 is avoided. The structure of DTC 64 in FIG. 10A may have different configurations, such as the step-wise structure present on both sides, the conductive plugs 154 are distributed on the step-wise structures on both sides and the conductive plug 154 landing on the topmost conductive layer 146 has more freedom to be placed on the step-wise structure of the left side, the step-wise structure of the right side, or the extended portions among the deep trenches 150, such as illustrated in FIG. 10B. The formation of the DTC 64 in FIG. 10B is similar to the formation of the DTC 64 in FIG. 8E. The similar descriptions are not repeated here for simplicity. However, the step-wise structure of the stack of the conductive layers 146 and the dielectric layers 148 may be formed by multiple patterning processes, wherein each patterning process forms one step of the stack, and each patterning process may include one lithography process and one etch process. Furthermore, the patterning of the dielectric material layer 162 to form the via holes 166 may include multiple patterning processes to form the via holes 166 expose the respective conductive layers 146 at different levels. Alternatively, the patterning of the dielectric material layer 162 to form the via holes 166 may include a single patterning process to form the via holes 166 expose the respective conductive layers 146 at different levels. In this case, the etching process selectively etch the dielectric layers 148 and stops on the conductive layers 146.

Additionally, since the short issue to the intervening conductive layers 146 is eliminated, the dielectric material layer 168 is skipped. The conductive plugs 154 are further illustrated in FIGS. 11A through 11C.

The DTC 64 in FIG. 8E presents other advantages over the DTC 64 in FIG. 10B. Since conductive plugs can be placed more closely without step-wise structure and reduces the size of the DTC 64 and increases the packing density. As stated above, the existing barrier layer either causes peeling issues or is too thick to reduce the opening size of the via holes and filling capability. The disclosed materials to the conductive plugs can have substantially reduced thickness and can still provide enough adhesion and eliminate the peeling issue. Accordingly, the DTC 64 in both FIGS. 8E and 10 can substantially reduce the opening diameter of the via holes 166, such as from 2000 A to 30 A according to one example. The height of the conductive plugs 154 and the depths of the via holes 166 can also be substantially reduced, and the thickness of the dielectric material layer 162 is also reduced, such as from a thickness greater than 5 microns to a thickness less than 1 micron.

Figure 12A:
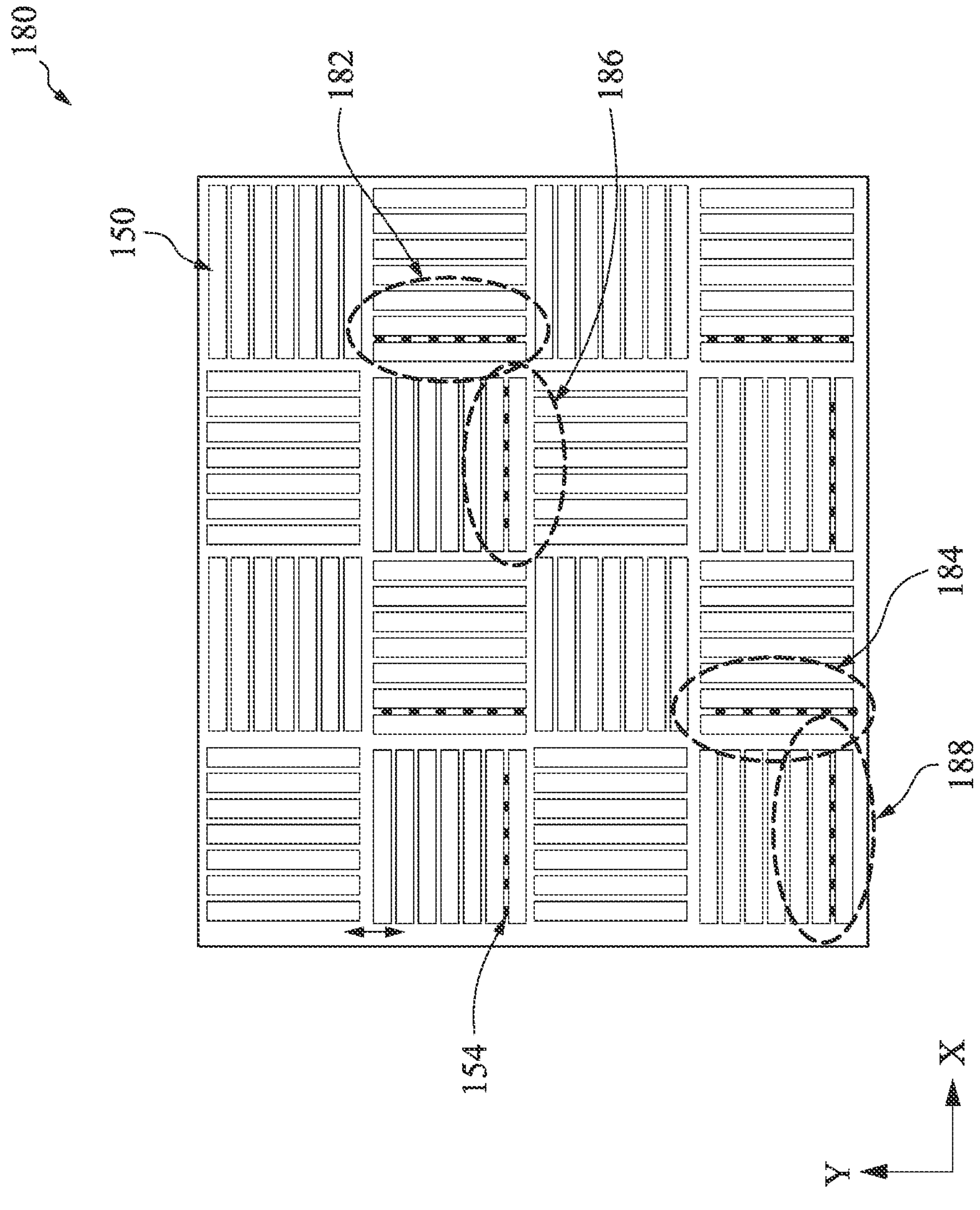
FIG. 12A is a top view of a deep trench capacitor structure, constructed at various fabrication stages according to various embodiments of the present disclosure.
Figure 12B:
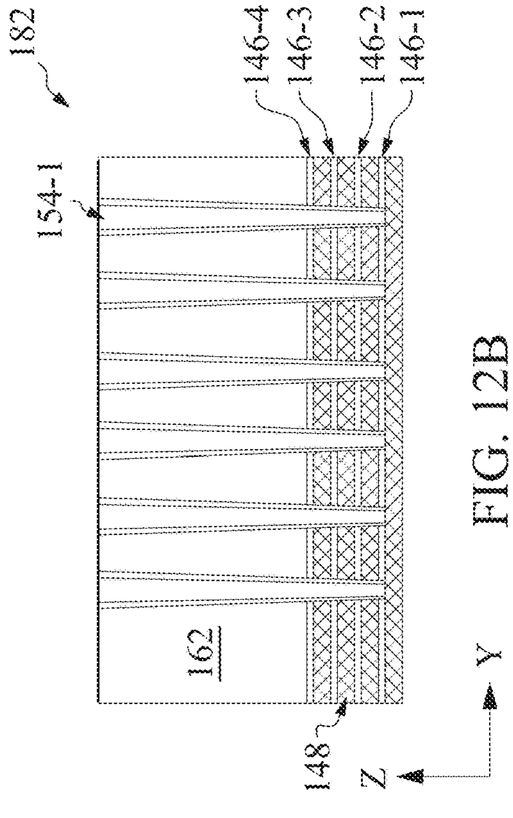
FIGS. 12B, 12C, 12D and 12E are sectional views of the deep trench capacitor structure of FIG. 12A, constructed according to various embodiments of the present disclosure.
Figure 12C:
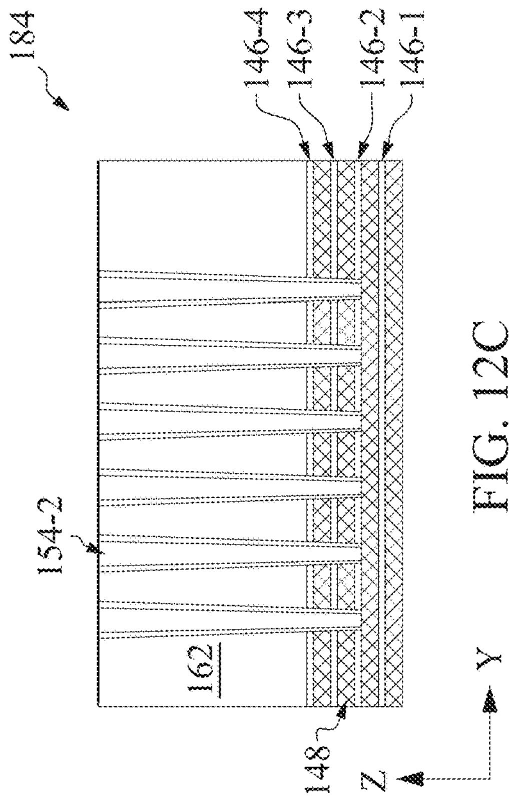
Figure 12D:
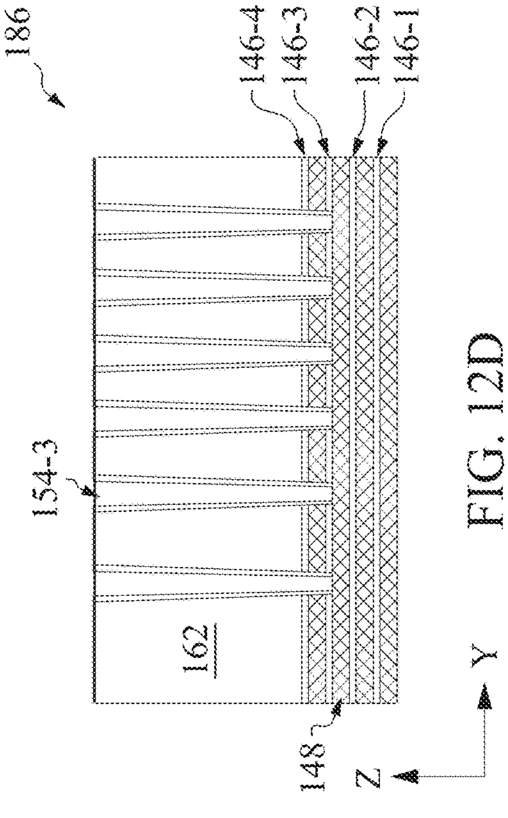
Figure 12E:
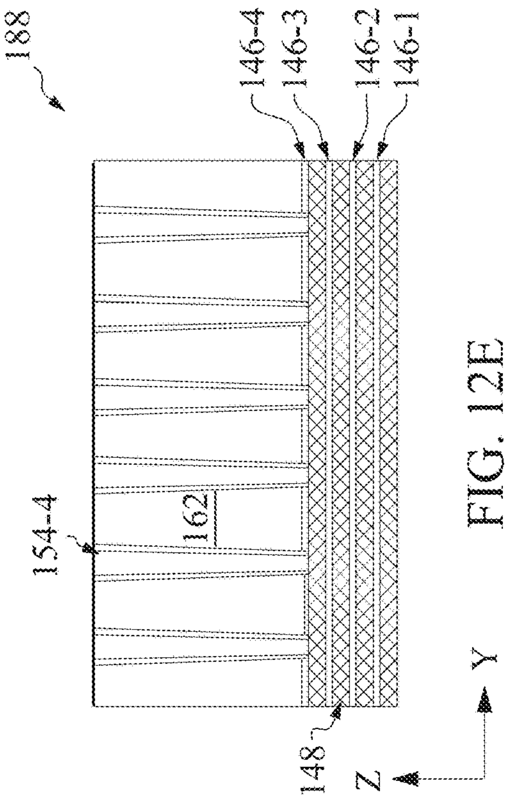
Figure 12F:
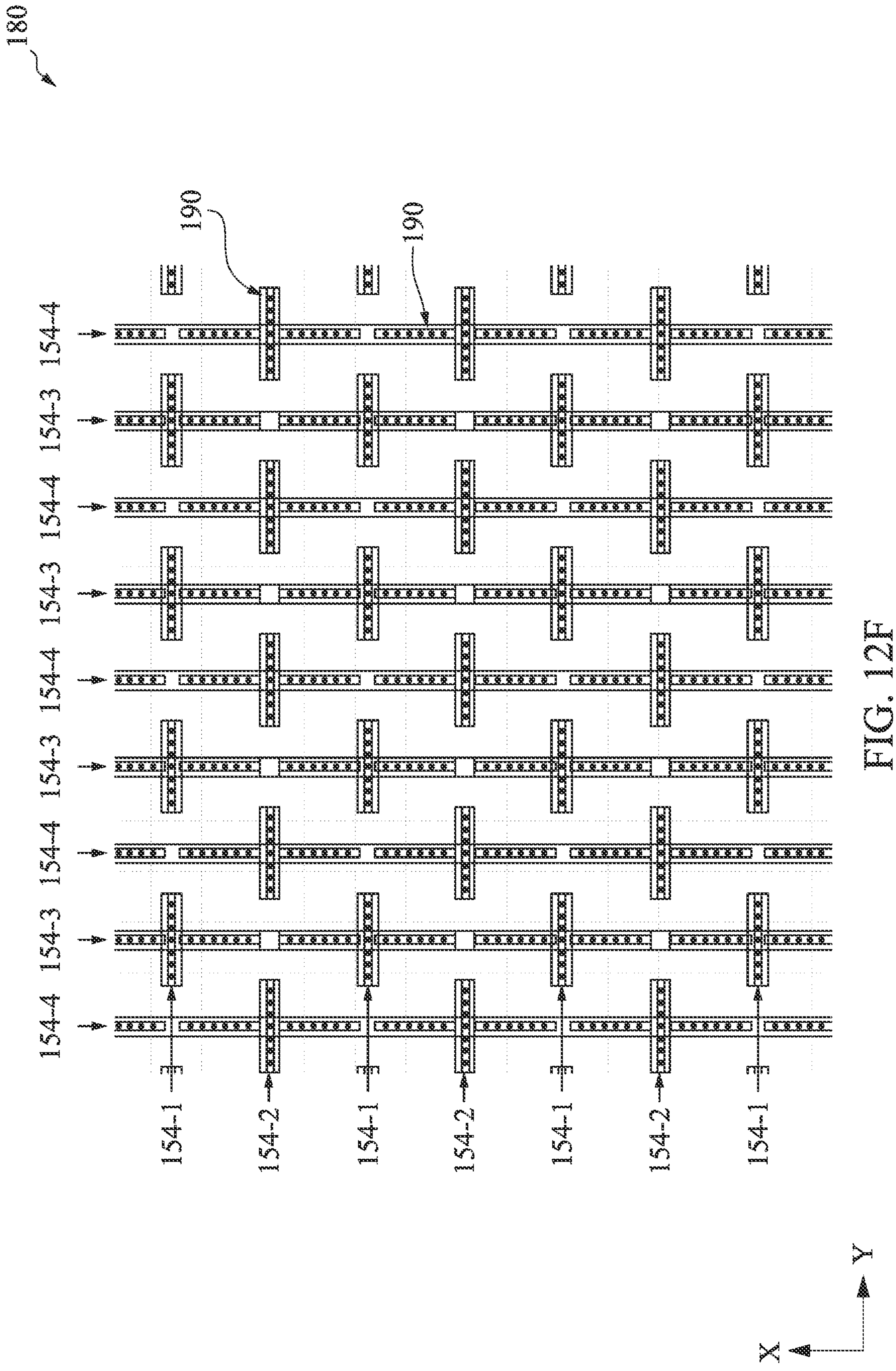
FIG. 12F is a top view of the deep trench capacitor structure of FIG. 12A, constructed according to various embodiments of the present disclosure.

Other embodiments of a deep trench capacitor structure 180 are illustrated in FIGS. 12A through 12F, constructed according to various aspects of the present disclosure. FIG. 12A is a fragmentary top view of a DTC structure 180, in portion or entirety. FIGS. 12B through 12E are fragmentary sectional views of a DTC structure 180, in portion, such as portions 182, 184, 186 and 188, respectively. FIG. 12F is a fragmentary top view of a DTC structure 180, in portion, especially the conductive plugs 154 and first metal lines 190 of an interconnect structure. The interconnect structure includes metal lines distributed in multiple metal layers, contacts between the first metal layer and the substrate, and vias among the metal layers to provide electrical routing to couple various devices into an integrated circuit. Particularly, the first metal layer includes first metal lines 190 with a particular layout, which is described below in detail. The structure of the DTC structure 180 is similar to the structure of the DTC 64 in FIGS. 7A-7E. However, all conductive layers inserted in deep trenches 150 oriented along X and Y directions are connected into a single deep trench capacitor 180. Each conductive layer 146 is connected to multiple conductive plugs 154 for redundancy. In the illustrated embodiment, the number N1 of the conductive layers 146 is 4, labeling, from the bottommost one to the topmost one, as 146-1, 146-2, 146-3 and 146-4, respectively. Accordingly, the conductive plugs 154 landing on the conductive layers 146-1, 146-2, 146-3 and 146-4 are referred to as conductive plugs 154-1, 154-2, 154-3 and 154-4, respectively. Especially, the first metal lines 190 are landing on the conductive plugs 154 and are configured to connect the conductive plugs 154-1 and 154-3 together to form the first electrode A, and connect the conductive plugs 154-2 and 154-4 together to form the second electrode B. To achieve that, the first metal lines 190 are not oriented along one direction but are oriented along X and Y directions, respectively. Furthermore, the first metal lines 190 oriented along X direction and the first metal lines 190 oriented along Y direction are cross each other (therefore electrically connected with each other) to form a layout of the first metal lines 190 having cross structures, as illustrated in FIG. 12F.

The present disclosure provides a deep trench capacitor structure and a method making the same. The deep trench capacitor includes multiple conductive layers and dielectric layers alternatively stacked and connected through the conductive plugs to form an interleaved capacitor. Furthermore, the stack of the conductive layers and the dielectric layers is folded and inserted into one or more deep trenches. The conductive plugs are designed with multiple layers of metal and metal alloy to increase the adhesion and reduce the peeling issue of the fill metal of the conductive plugs. Additionally, a dielectric material layer may be further deposited to surround sidewalls of the conductive plugs to prevent the short to the intervening conductive layers in some embodiments. Though not intended to be limiting, embodiments of the present disclosure offer benefits for semiconductor processing and semiconductor devices. For example, the disclosed structure and method allows substantial reduction to various dimensions of the deep trench capacitor, such as the height and diameter of the conductive plugs.

In one aspect, the present disclosure provides an integrated circuit (IC) structure that includes a first substrate having an integrated circuit formed thereon; a second substrate bonded to the first substrate; and a deep trench capacitor formed on the second substrate and electrically connected to the integrated circuit. The deep trench capacitor includes a stack of conductive layers and dielectric layers disposed in deep trenches, and conductive plugs landing on the conductive layers, respectively. Each of the conductive plugs includes a first metal layer, a second metal layer disposed on the first metal layer, and a third metal layer disposed on the second metal layer. The first, second and third metal layers are different in composition.

In another aspect, the present disclosure provides an integrated circuit (IC) structure. The IC structure includes deep trench capacitors formed on a first substrate and configured in an array. The deep trench capacitors include a first deep trench capacitor disposed in first deep trenches longitudinally oriented in a first direction; and a second deep trench capacitor being adjacent the first deep trench capacitor in the array and disposed in second deep trenches longitudinally oriented in a second direction that is orthogonal to the first direction. Each of the deep trench capacitors includes a stack of conductive layers and dielectric layers disposed in deep trenches, and conductive plugs landing on the conductive layers, respectively. Each of the conductive plugs includes a first metal layer, a second metal layer disposed on the first metal layer, and a third metal layer disposed on the second metal layer. The first, second and third metal layers are different in composition.

In yet another aspect, the present disclosure provides a method. The method includes forming first trenches on a first substrate; forming a stack including conductive layers and dielectric layers in the first trenches, wherein the conductive layers and the dielectric layers alternate with one another within the stack; forming a dielectric feature over the stack and the first trenches; forming openings in the dielectric feature, thereby exposing the conductive layers within the openings, respectively; depositing a first metal layer in the openings; depositing a second metal layer on the first metal layer, the second metal layer including an alloy of copper and manganese; and depositing a third metal layer on the second metal layer, the third metal layer including one of tungsten, copper, and an alloy of copper aluminum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:

a first substrate having an integrated circuit formed thereon;

a second substrate bonded to the first substrate; and a first deep trench capacitor formed on the second substrate and electrically connected to the integrated circuit, wherein the first deep trench capacitor includes a stack of conductive layers and dielectric layers disposed in first deep trenches, and conductive plugs landing on the conductive layers, respectively, wherein each of the conductive plugs includes a first metal layer contacting one conductive layer of the stack of conductive layers and dielectric layers, a second metal layer disposed on the first metal layer, and a third metal layer disposed on the second metal layer, wherein the first metal layer includes cobalt and nickel, the second metal layer includes copper and manganese, and the third metal layer includes copper.

2. The IC structure of claim 1, further comprising:

a second deep trench disposed next to the first deep trench; and a third deep trench disposed next to the second deep trench, wherein the stack of conductive layers and dielectric layers extends from the first deep trench into the second and third deep trenches, the conductive layers include a first number of the conductive layers, and the conductive plugs include a second number of the conductive plugs, and the second number equals to the first number, and the first number is 4.

3. The IC structure of claim 2, wherein the conductive layers laterally extend to first ends along a first direction beyond the first deep trench and laterally extend to second ends along a second direction opposite to the first direction beyond the third deep trench, the first ends of the conductive layers being distanced from each other and the second ends of the conductive layers being at a same location in a top view; and the conductive plugs have different heights landing on respective conductive layers.

4. The IC structure of claim 1, further comprising a plurality of deep trench capacitors formed on the second substrate and configured as an array, wherein a first one of the deep trench capacitors disposed in first deep trenches, wherein the first deep trenches are longitudinally oriented in a first direction and spaced from each other along a second direction being orthogonal to the first direction; and a second one of the deep trench capacitors disposed in second deep trenches longitudinally oriented in the second direction and spaced from each other along the first direction, the second one of the deep trench capacitors being adjacent to the first one of the trench capacitors in the array.

5. The IC structure of claim 4, wherein the first one of the deep trench capacitors includes a plurality of first conductive plugs disposed between adjacent two of the first deep trenches and aligned along the first direction.

6. The IC structure of claim 5, wherein the second one of the deep trench capacitors includes a plurality of second conductive plugs disposed between adjacent two of the second deep trenches and aligned along the second direction.

7. An integrated circuit (IC) structure, comprising deep trench capacitors formed on a first substrate and configured in an array, wherein the deep trench capacitors include a first deep trench capacitor disposed in first deep trenches longitudinally oriented in a first direction and spaced away from each other along a second direction that is orthogonal to the first direction; and a second deep trench capacitor being adjacent the first deep trench capacitor in the array and disposed in second deep trenches longitudinally oriented in the second direction and spaced away from each other along the first direction, wherein each of the deep trench capacitors includes a stack of conductive layers and dielectric layers disposed in deep trenches, and conductive plugs landing on the conductive layers, respectively, wherein each of the conductive plugs includes a first metal layer contacting one conductive layer of the stack of conductive layers and dielectric layers, a second metal layer disposed on the first metal layer, and a third metal layer disposed on the second metal layer, the first, second and third metal layers being different in composition, wherein the first metal layer includes cobalt and nickel, the second metal layer includes copper and manganese, and the third metal layer includes copper.

8. The IC structure of claim 7, further comprising a second substrate having an integrated circuit formed thereon, wherein the second substrate is bonded to the first substrate; and the deep trench capacitors are electrically connected to the integrated circuit.

9. The IC structure of claim 8, wherein the conductive plugs of the first deep trench capacitor have different heights landing on the conductive layers, respectively.

10. The IC structure of claim 7, wherein the stack of conductive layers and dielectric layers of the first deep trench capacitor includes a first segment extended along a third direction onto a dielectric feature beyond the first deep trenches to first ends, and a second segment extended along a fourth direction onto the dielectric feature beyond the first deep trenches to second ends, the fourth direction being opposite to the third direction, and the first ends of the conductive layers being distanced from each other and the second ends of the conductive layers being at a same location in a top view;

the first segment includes a step-wise structure with the conductive layers of the first deep trench capacitor laterally extending respective lengths different from each other along the third direction;

the second segment includes a flat edge structure with the conductive layers of the first deep trench capacitor laterally extending a same length along the fourth direction; and the conductive plugs of the first trench capacitor landing on the conductive layers of the first deep trench capacitor, respectively.

11. The IC structure of claim 10, further comprising:

a first dielectric layer disposed on the stack of conductive layers and dielectric layers and including a silicon oxide film and a silicon nitride film on the silicon oxide film;

a second dielectric layer disposed on the first dielectric layer and including undoped silica glass (USG);

the first dielectric layer includes a first portion contacting sidewalls of the first ends of the conductive layers, and a second portion contacting sidewalls of the second ends of the conductive layers; and the first portion of the first dielectric layer has an uneven edge structure and a second portion has a flat edge structure, in a sectional view.

12. The IC structure of claim 10, further comprising a dielectric material layer laterally surrounding sidewalls of each of the conductive plugs of the first deep trench capacitor, wherein the dielectric material layer is different from the dielectric feature in composition; and the dielectric material layer is absent from bottom surfaces of the conductive plugs of the first deep trench capacitor.

13. The IC structure of claim 7, wherein the conductive plugs of the first deep trench capacitor are disposed between adjacent two of the first deep trenches and aligned along the first direction in a top view.

14. The IC structure of claim 7, wherein the conductive plugs of the first deep trench capacitor are disposed on a first side of the first deep trenches and aligned along the first direction in a top view; and the conductive plugs of the second deep trench capacitor are disposed between adjacent two of the second deep trenches and aligned along the second direction in a top view.

15. The IC structure of claim 7, further comprising an interconnect structure disposed on the first and second deep trench capacitors, wherein the interconnect structure includes a first metal layer having first metal lines connected to the conductive plugs, and wherein the first metal lines include a first subset of the first metal lines longitudinally oriented along the first direction and a second subset of the first metal lines longitudinally oriented along the second direction.

16. An integrated circuit (IC) structure, comprising a first substrate;

a second substrate having an integrated circuit formed thereon and boned to the first substrate; and deep trench capacitors formed on the first substrate and configured in an array and electrically connected to the integrated circuit, wherein the deep trench capacitors include a first deep trench capacitor disposed in first deep trenches longitudinally oriented in a first direction, a second deep trench capacitor being adjacent the first deep trench capacitor in the array and disposed in second deep trenches longitudinally oriented in a second direction that is orthogonal to the first direction, and wherein each of the deep trench capacitors includes a stack of conductive layers and dielectric layers disposed in deep trenches, conductive plugs are landing on the conductive layers, respectively, wherein each of the conductive plugs includes a first metal layer contacting one conductive layer of the stack of conductive layers and dielectric layers, a second metal layer disposed on the first metal layer, and a third metal layer disposed on the second metal layer, the first, second and third metal layers being different in composition, wherein the first metal layer includes cobalt and nickel, the second metal layer includes copper and manganese, and the third metal layer includes copper, and the conductive plugs of the first deep trench capacitor have different heights and are landing on different ones of the conductive layers, respectively.

17. The IC structure of claim 16, wherein the stack of conductive layers and dielectric layers of the first deep trench capacitor includes a first segment extended along a third direction onto a dielectric feature beyond the first deep trenches to first ends, and a second segment extended along a fourth direction onto the dielectric feature beyond the first deep trenches to second ends;

the first segment includes a step-wise structure with the conductive layers of the first deep trench capacitor laterally extending respective lengths different from each other;

the second segment includes a flat edge structure with the conductive layers of the first deep trench capacitor laterally extending a same length;

the conductive plugs of the first trench capacitor landing on the conductive layers of the first deep trench capacitor, respectively; and the conductive plugs of the first deep trench capacitor are disposed between adjacent two of the first deep trenches and aligned along the first direction in a top view.

18. The IC structure of claim 10, further comprising a dielectric material layer laterally surrounding sidewalls of each of the conductive plugs of the first deep trench capacitor, wherein the dielectric material layer is different from the dielectric feature in composition, and wherein the dielectric material layer is absent from bottom surfaces of the conductive plugs of the first deep trench capacitor; and an interconnect structure disposed on the first and second deep trench capacitors, wherein the interconnect structure includes a first metal layer having first metal lines connected to the conductive plugs, and wherein the first metal lines include a first subset of the first metal lines longitudinally oriented along the first direction and a second subset of the first metal lines longitudinally oriented along the second direction.

19. The IC structure of claim 3, further comprising:

a first dielectric layer disposed on the stack of conductive layers and dielectric layers and including a silicon oxide film and a silicon nitride film on the silicon oxide film;

a second dielectric layer disposed on the first dielectric layer and including undoped silica glass (USG);

the first dielectric layer includes a first portion contacting sidewalls of the first ends of the conductive layers, and a second portion contacting sidewalls of the second ends of the conductive layers; and the first portion of the first dielectric layer has a step-wise structure and a second portion has a flat edge structure, in a sectional view.

20. The IC structure of claim 16, further comprising:

a first dielectric layer disposed on the stack of conductive layers and dielectric layers and including a silicon oxide film and a silicon nitride film on the silicon oxide film;

a second dielectric layer disposed on the first dielectric layer and including undoped silica glass (USG);

the first dielectric layer includes a first portion contacting sidewalls of the first ends of the conductive layers, and a second portion contacting sidewalls of the second ends of the conductive layers; and the first portion of the first dielectric layer has a step-wise structure and a second portion has a flat edge structure, in a sectional view.

* * * * *